(12) United States Patent
Yudovsky et al.

(10) Patent No.: US 7,748,542 B2
(45) Date of Patent: Jul. 6, 2010

(54) BATCH DEPOSITION TOOL AND COMPRESSED BOAT

(75) Inventors: Joseph Yudovsky, Campbell, CA (US); Robert C. Cook, Pleasanton, CA (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 799 days.

(21) Appl. No.: 11/216,969

(22) Filed: Aug. 31, 2005

(65) Prior Publication Data

US 2007/0059128 A1     Mar. 15, 2007

(51) Int. Cl.
     *A47G 19/08*     (2006.01)
(52) U.S. Cl. .................................. 211/41.18
(58) Field of Classification Search .............. 211/41.18, 211/41.1, 41.12, 49.1; 206/711, 454, 710; 118/500; 414/935
     See application file for complete search history.

(56) References Cited

U.S. PATENT DOCUMENTS

| | | | | | |
|---|---|---|---|---|---|
| 3,889,815 | A | * | 6/1975 | Merle | 211/41.1 |
| 4,191,295 | A | * | 3/1980 | Tams, III | 211/41.1 |
| 4,568,234 | A | | 2/1986 | Lee et al. | |
| 4,679,689 | A | * | 7/1987 | Blome | 206/711 |
| 4,770,590 | A | * | 9/1988 | Hugues et al. | 414/172 |
| 5,054,418 | A | * | 10/1991 | Thompson et al. | 118/500 |
| 5,310,339 | A | | 5/1994 | Ushikawa | |
| 5,503,173 | A | * | 4/1996 | Kudo et al. | 134/201 |
| 5,749,469 | A | | 5/1998 | Williams | |
| 5,913,429 | A | | 6/1999 | Han | |
| 6,041,938 | A | * | 3/2000 | Senn | 206/711 |
| 6,099,302 | A | | 8/2000 | Hong et al. | |
| 6,352,593 | B1 | | 3/2002 | Brors et al. | |
| 6,716,027 | B2 | | 4/2004 | Kim et al. | |
| 6,799,940 | B2 | | 10/2004 | Joe et al. | |
| 6,835,039 | B2 | * | 12/2004 | van den Berg et al. | 414/217 |
| 7,246,708 | B2 | * | 7/2007 | Chuang et al. | 211/41.18 |
| 2002/0017241 | A1 | | 2/2002 | Shimizu et al. | |
| 2003/0049372 | A1 | | 3/2003 | Cook et al. | |
| 2004/0052618 | A1 | | 3/2004 | Tometsuka | |
| 2005/0008352 | A1 | | 1/2005 | Matsunaga et al. | |
| 2006/0151404 | A1 | * | 7/2006 | Blattner et al. | 211/41.18 |

OTHER PUBLICATIONS

PCT International Search Report and Written Opinion dated Aug. 7, 2007 for International Application No. PCT/US2006/32413.
First Office Action mailed May 8, 2009 in Chinese Application No. 200680030747.5.

\* cited by examiner

*Primary Examiner*—Sarah Purol
(74) *Attorney, Agent, or Firm*—Patterson & Sheridan

(57) ABSTRACT

Aspects of the invention include methods and apparatus for processing a batch of substrates. In one embodiment, a compressed substrate boat is configured to reduce pumping volume in a batch processing chamber. The compressed substrate boat comprises a stationary substrate boat and a movable substrate boat, each may be loaded/unloaded independently. The movable substrate boat and the stationary substrate boat may be interleaving with one another such that the distance between the substrates is reduced. In another embodiment, a substrate boat having removable substrate holder is configured to provide susceptors without dramatically increasing pumping volume. The removable substrate holder may be loaded/unloaded away from the substrate boat with susceptors. The removable substrate holder is engaged with the substrate boat such that substrates thereon are interleaving with the susceptors. Embodiments of the present invention reduces pumping volume and increases throughput, hence reduces cost of ownership during batch processing.

15 Claims, 17 Drawing Sheets

BATCH DEPOSITION TOOL AND COMPRESSED BOAT

BACKGROUND OF THE INVENTION

1. Field of the Invention

Embodiments of the invention generally relate to methods and apparatus for supporting and transferring substrates and reducing pumping volume during batch processing. Embodiments of the invention also relate to methods and apparatus for uniform gas delivery and uniform heat transfer in a batch processing chamber.

2. Description of the Related Art

The effectiveness of a substrate fabrication process is often measured by two related and important factors, which are device yield and the cost of ownership (COO). These factors are important since they directly affect the cost to produce an electronic device and thus a device manufacturer's competitiveness in the market place. The COO, while affected by a number of factors, is greatly affected by the number of substrates produced per hour. Batch processing effectively improving effectively improves COO by substantially increasing the number of substrates processed without substantially increasing expenses.

The term batch processing generally indicates a process step that can process two or more substrates at one time. The advantages of batch processing are generally twofold. On the one hand, batch processing can increase system throughput by performing a process recipe step that is disproportionately long compared to other process recipe steps in a substrate processing sequence. On the other hand, in some processing steps, such as ALD and CVD, where expensive precursor materials are used, batch processing can greatly reduce usage of precursor gases compared to single substrate processing. A batch processing chamber having a large ratio of substrate surface area to chamber volume is desirable to reduce the usage of precursor gases.

Substrates are generally supported and transferred by a substrate boat during batch processing. FIG. 1 is a sectional view of a batch processing chamber 100 having a typical prior art substrate boat 101. A plurality of substrates 140 are generally placed in the substrate boat 101 on susceptors 104 which are supported by a plurality of bars 106. Each substrate 140 may rest directly on a perspective susceptor 104, or may be suspended between two susceptors 104 on three or more pins (not shown) attached to the surface of the perspective susceptor 104. The plurality of bars 106 are generally attached to a bottom plate 105 and a top plate 102. The bottom plate 105 may be generally connected to a shaft 118 which configured to convey vertical and rotary movements to the substrate boat 101. The shaft 118 is coupled to a rotary seal 107 which is positioned in a bore 109 of a seal plate 108. The seal plate 108 is configured to move vertically. When the seal plate 108 is in an upper position, as shown in FIG. 1, the substrate boat 101 is inserted into a vacuum chamber 112 formed by chamber walls 110 and the seal plate 108. When the seal plate is in a lower, the substrate boat 101 is removed from the vacuum chamber 112, not shown. The batch processing chamber 100 in FIG. 1 is shown in its processing position in which the vacuum chamber 112 is insulated. One or more inlets 122 in fluid communication with the vacuum chamber 112 are generally provided for supplying processing or carrier gas into the vacuum chamber 112. In one aspect, an injector 120 having a plurality of holes 124 may be positioned in one side of the substrate boat 101 and connected to the inlets 122. The plurality holes 124 may form a vertical shower head to evenly deliver gas up and down the vacuum chamber 112. An exhaust assembly 130 in fluid communication with an outlet 132 may be generally positioned on an opposite side from the injector 120. In one aspect, a plurality of slots corresponding to the holes 124 of the injector 120 may be formed in the exhaust assembly 130 to further facilitate horizontal flow near the surface of each substrate 140.

FIG. 2 is a perspective view of a typical prior art substrate boat 200. The substrate boat 200 may have a top plate 202, a bottom plate 205, and a plurality of support members 206 vertically extended between the top plate 202 and the bottom plate 205. In some cases, each of the plurality of support members 206 has plurality of recesses 203 configured to hold substrates therein. In other cases, each of the plurality of support members 206 generally has a plurality of support fingers 204 extended therefrom configured to support substrates 240. The support fingers 204 are generally positioned evenly on each of the plurality of the supporting member 206. The support fingers 204 with the same heights are configured to support the same substrate 204. It is also common for a substrate boat to have ring shaped susceptors which may or may not be in direct contact with substrates.

Examples of hardware and methods used to perform batch processing is further described in U.S. patent application No. 6,352,593, entitled "Mini-batch Process Chamber" filed Aug. 11, 1997, and U.S. patent application Ser. No. 60/642,877, entitled "Flexible Substrate Sequencing System Using a Bath Processing Chamber" filed Jan. 10, 2005, which are hereby incorporated by reference in their entireties.

Due to the shrinking size of semiconductor devices and the ever increasing device performance requirements, the device fabrication process now requires greater uniformity and repeatability. Uniform gas delivery and heat transfer in a batch processing chamber is more difficult to achieve than in a single substrate system. Adding susceptors to a substrate boat used in a batch processing chamber is known to promote uniform gas delivery and heat transferring. However, including susceptors usually increases the pumping volume of the chamber.

Therefore, there is a need for a system, a method and an apparatus for batch processing that meet the required device performance goals and increase the system throughput.

SUMMARY OF THE INVENTION

The present invention generally relates to apparatus and methods of transferring and supporting substrates in a batch processing chamber.

One embodiment of the present invention relates to a compressed boat in a batch processing chamber. The compressed boat comprises a first substrate boat configured to receive and support substrates on a first plurality of parallel planes and a second substrate boat configured to receive and support substrates on a second plurality of parallel planes. The compressed boat further comprises a connecting mechanism configured to movably connect the first substrate boat and the second substrate boat, wherein the compressed boat has an open position and a closed position, wherein in the closed position the first plurality of parallel planes are interleaving with the second plurality of parallel planes and wherein in the open position the first and second substrate boats can be loaded and unloaded independently. This configuration compresses the boat size by requires less space between substrates during processing in the closed position.

Another embodiment of the present invention relates to a batch processing system for processing semiconductor substrates. The batch processing system generally comprises a first substrate boat, a second substrate boat, a load lock, and a processing chamber defining a processing region to process substrates, wherein the first and second substrate boats are arranged such that one of the first and second substrate boats occupies the load lock while the other occupies the processing chamber and the first and second substrate boats can swap locations.

Another embodiment of the present invention relates to method for receiving and transferring substrates during batch processing. The method generally comprises loading a first set of substrates into a first substrate boat, loading a second set of substrate into a second substrate boat, and interleaving the first substrate boat and the second substrate boat such that the first set of substrates and the second set of substrates are interleaving.

Another embodiment of the present invention relates to a substrate boat for a batch processing system. The substrate boat comprises a permanent part having a plurality of susceptors, and a substrate holder having a plurality of support pins, wherein the substrate holder is removably connected to the permanent part, when the substrate holder is connected to the permanent part, the plurality of support pins are interleaving with the plurality of susceptors, and the substrate holder can be loaded or unloaded when it is not connected to the permanent part.

Another embodiment of the present invention relates to a batch processing system. The batch processing system comprises a processing chamber, a load lock in communication with the processing chamber, a substrate boat configured to transfer substrates between the processing chamber and the load lock, and a first and a second substrate holders which are engaged to the substrate boat interchangeably. Each of the first and second substrate boats are configured to support a plurality of substrates during loading and unloading.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides an apparatus and method for batch processing that reduces cost of ownership (COO).

In some embodiments of the invention, reducing the volume of a batch processing chamber without reducing the number of substrates results in improved COO. Reducing the volume of a batch processing chamber reduces the usage of precursor gases and/or other processing materials. Furthermore, reducing the volume of an ALD batch processing chamber reduces the time it takes to assure that all of the surfaces are saturated with processing gases.

Figure 1:
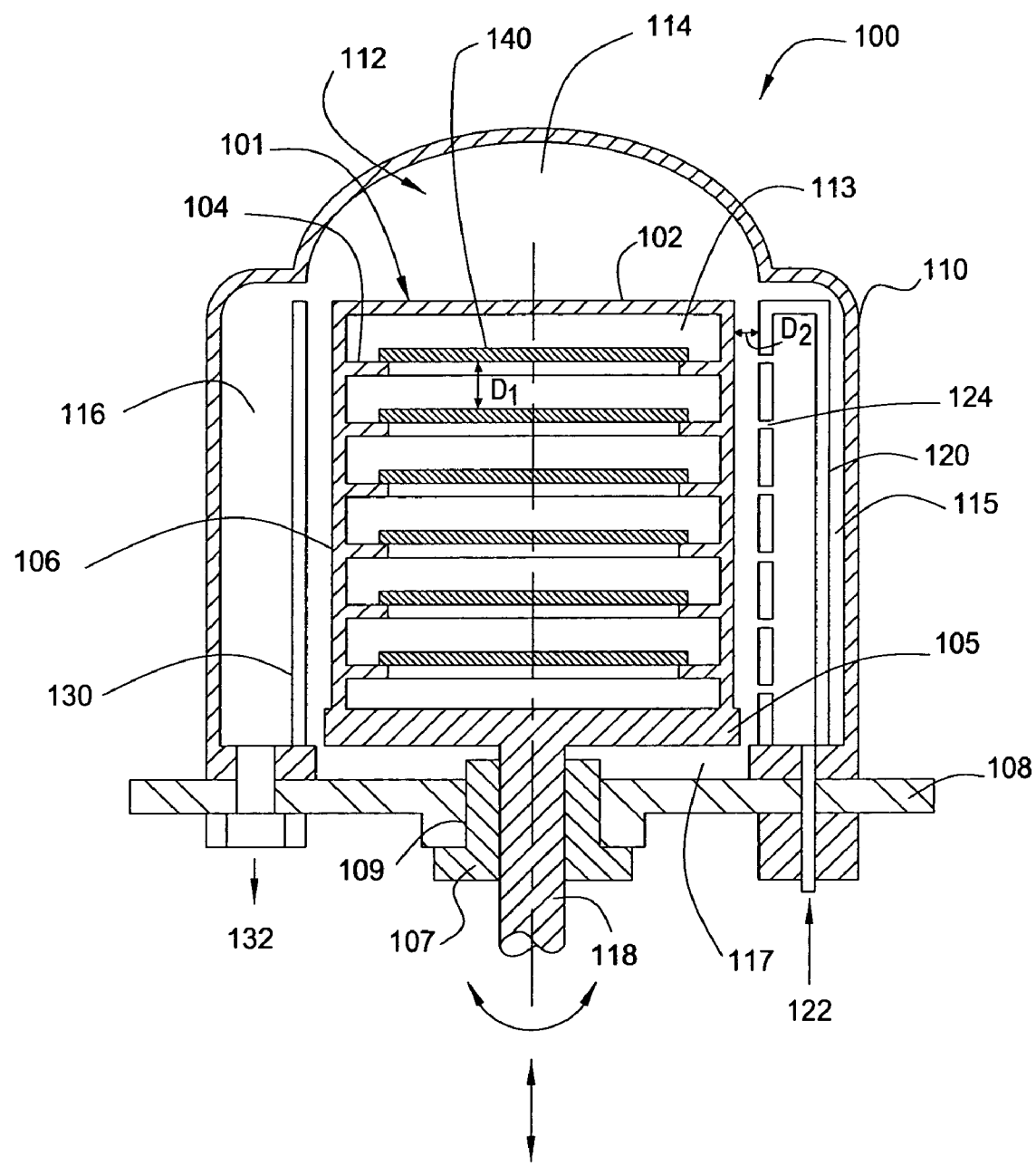
FIG. 1 is a sectional view of a batch processing chamber having a typical prior art substrate boat.
Figure 2:
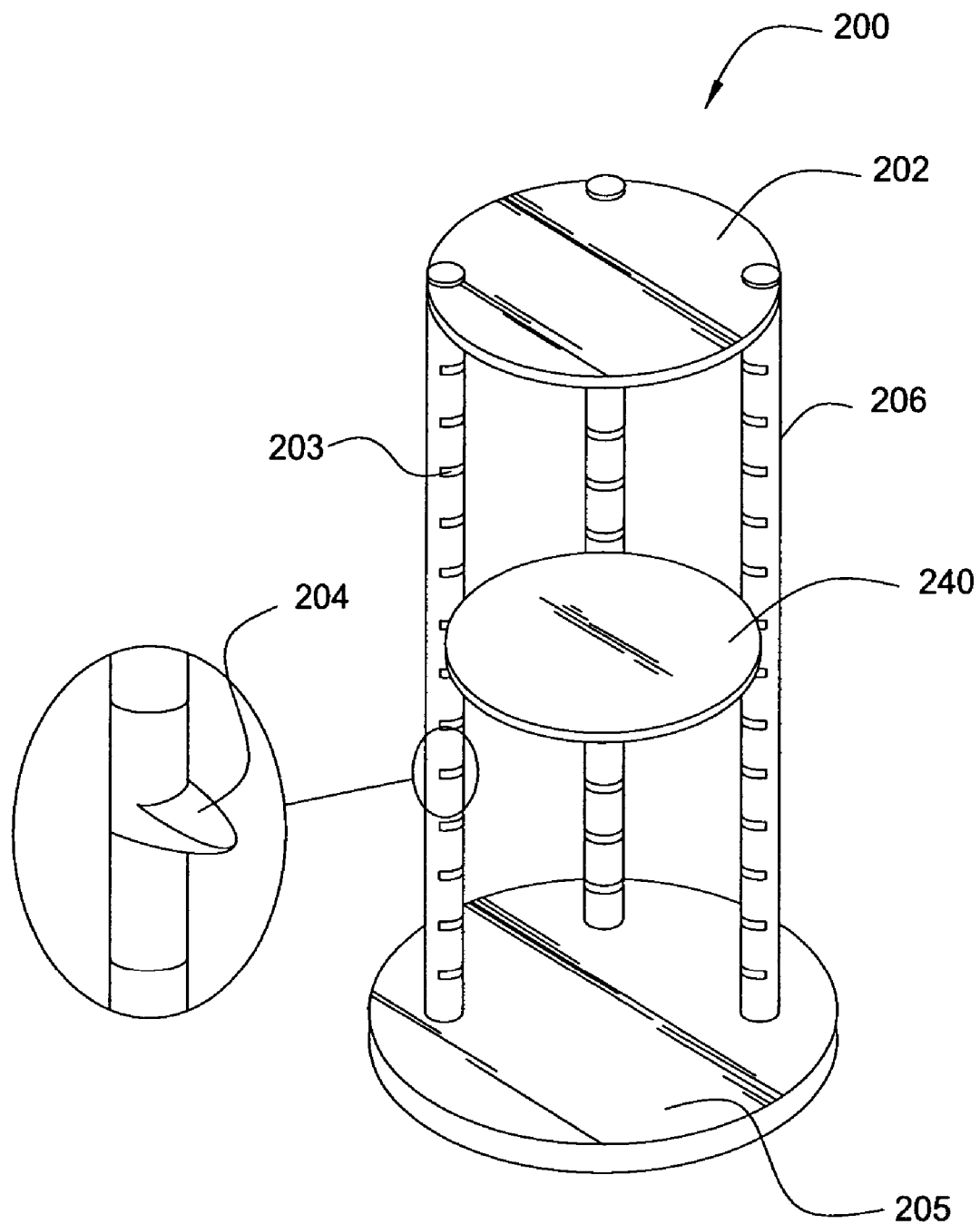
FIG. 2 is a perspective view of a typical prior art substrate boat.

In one aspect, reducing the size of a substrate boat is most effective in reducing the volume of a batch processing chamber. Referring to FIG. 1, the substrate boat 101 occupies the majority of the vacuum volume 112. Key factors determining the boat size generally include a distance D1 between each substrate 140 and its upper susceptor 104 and a distance D2 between the susceptors 104 and the chamber wall 110 or the injector 120 and the exhaust assembly 130. Thus, the vacuum volume 112 may be reduced by reducing D1 and/or D2. In case of D1, for an ALD batch processing chamber, the distance D1 is preferably in the range of about 0.15 to about 1.5 inches to achieve uniform deposited films on the substrates 140. Currently, however, D1 is limited to greater than 0.347 inches (8.8 mm) due to robot limit actions, which means that a robot configured to load and unload substrates from a substrate boat requires an additional distance between neighboring substrates for dependable loading and unloading. In case of substrate boats with disk shaped susceptors, robot limit actions require more distance between susceptors.

A compressed substrate boat comprises two substrate boats movably connected to one another. The compressed boat has an open and a closed position. While substrates may be loaded/unloaded in the open position and processed in the closed position. Each of the two substrate boat configured to hold a set of substrates may be loaded/unloaded independently. When the compressed boat is in the closed position, the substrates held by the two substrate boats interleave with one another. Thus, distance between the substrates is reduced by half during batch processing.

Figure 3:
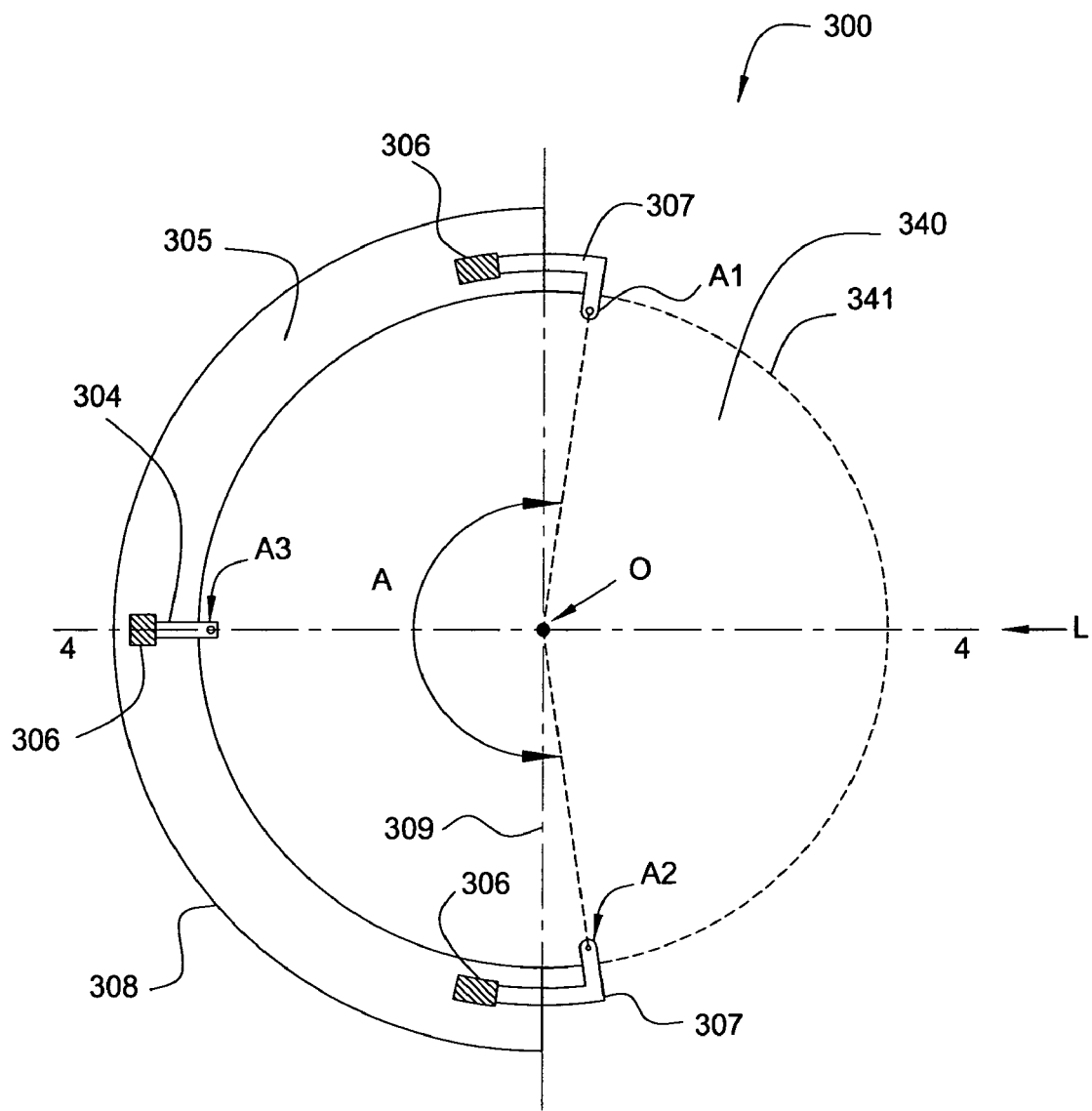
FIG. 3 is a sectional view from top of an exemplary interleavable substrate boat.
Figure 4:
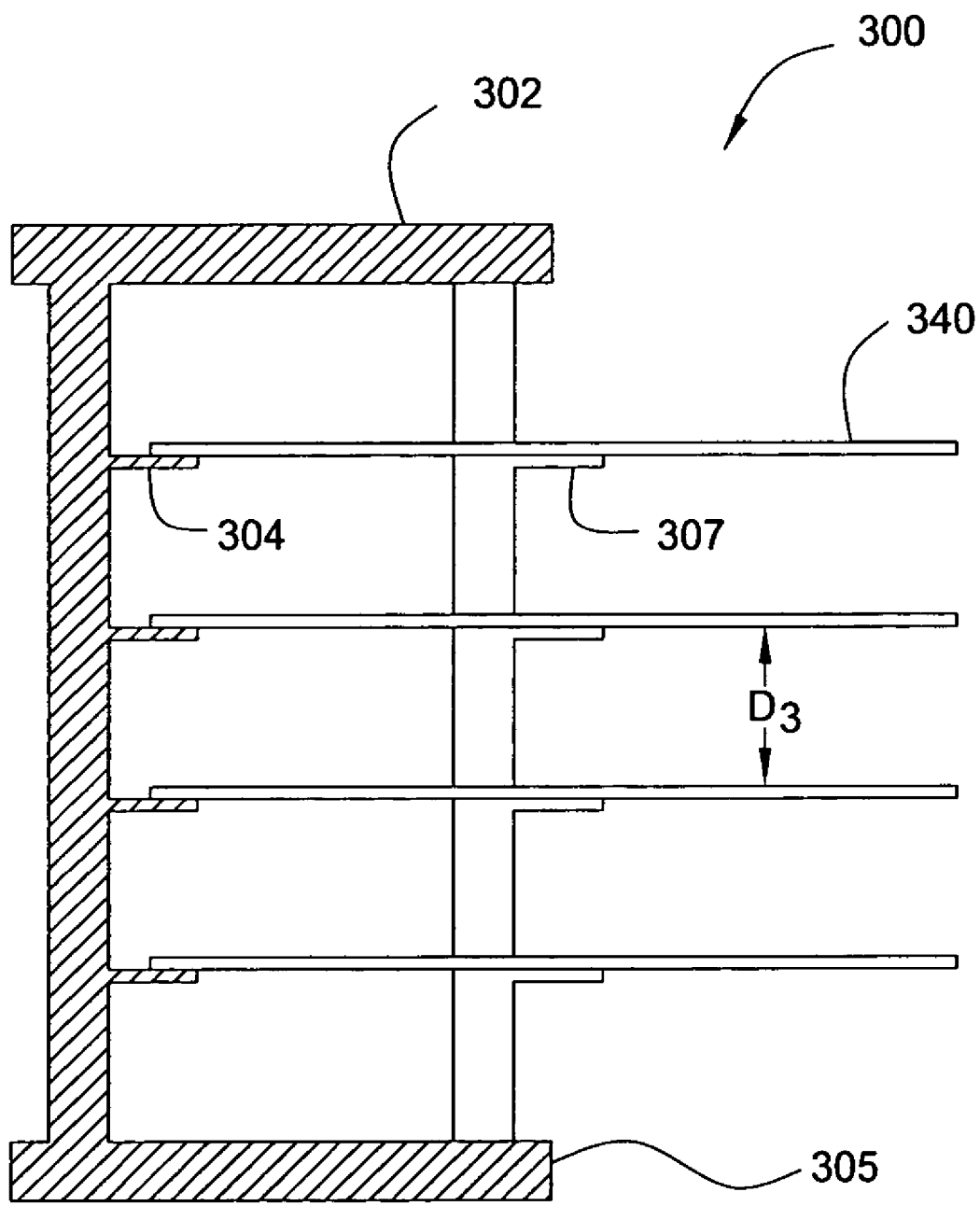
FIG. 4 is a sectional view along line 4-4 of the substrate boat shown in FIG. 3.

FIG. 3 is a sectional view of an exemplary substrate boat 300. FIG. 4 is a sectional view along line 4-4 of the substrate boat shown in FIG. 3. The substrate boat 300 generally comprises a top plate 302 (shown in FIG. 4), a bottom plate 305, and a plurality of support members 306 vertically extended between the top plate 302 and the bottom plate 305. In one aspect, the top plate 302 and the bottom plate 305 may have a shape of a semicircle. The plurality of supporting members 306 may be arranged along a perimeter of the bottom plate 305 and the top plate 302. In one aspect, there may be three support members 306 and two of which are arranged near a straight edge 309 of the bottom plate 305 and the top plate 302. Each of the two support members 306 positioned near the straight edge 309 may have a plurality of curved fingers 307 extended out of the straight edge 309 of the bottom plate 305 and curved back inside a circle 341 designated for a substrate 340. A third support member 306 may be generally positioned in a center of a semicircle curve 308. A plurality of straight supporting fingers 304 may be generally extended from the third support member 306 toward inside of the circle 341.

As shown in FIG. 3, the substrate 340 may be supported by the curved fingers 307 and the straight supporting fingers 304 at points A1, A2 and A3. In one aspect, angle A, formed by A1, O (center of the circle 341) and A2, is in the range of about 190 and 200 degrees. The substrate boat 300 confines the vertical support members 306 within a semicircle and at the same time provides a steady three point support of A1, A2 and A3 that cover more than a half circle for the substrate 340 supported thereon. It should be noted various designs, arrangements and combinations of a bottom plate, a top plate, support members, and support fingers may be used to implement a substrate boat. In one embodiment, the top plate 302 and the bottom plate 305 may have a shape other than a semicircle, such as, for example, a semi-ring.

Referring to FIG. 4, the plurality of substrates 340 held in the substrate boat 300 are generally evenly distributed in the vertical direction. Each of the substrates 340 has a distance D3 to its immediate neighboring substrate. The distance D3 may be minimized down to a robot limit of a semiconductor processing system.

Figure 5:
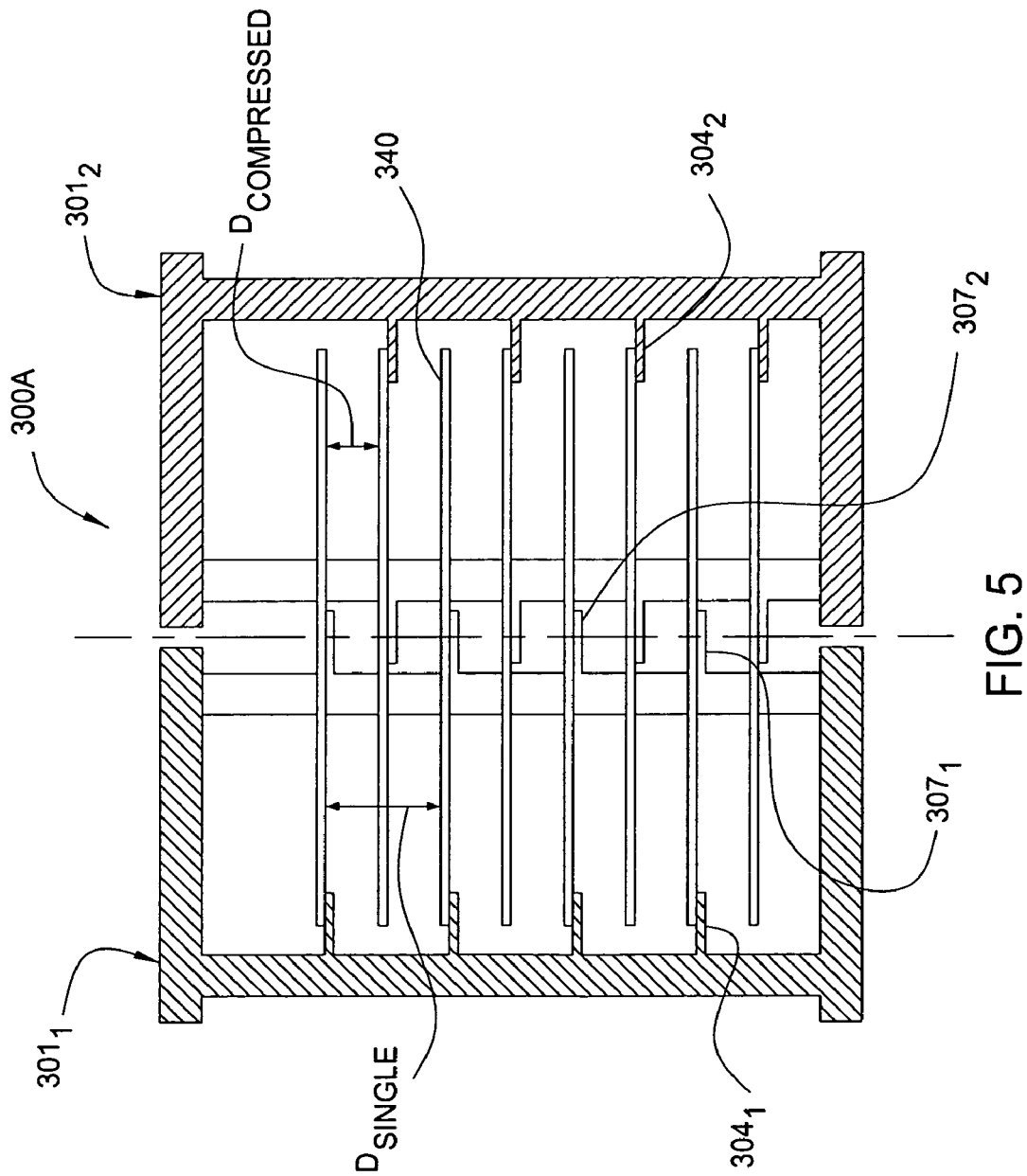
FIG. 5 is a sectional view of an exemplary compressed boat having two interleavable substrate boats.

FIG. 5 is a schematic sectional view of an exemplary compressed substrate boat 300A combining two substrate boats $301_1$ and $301_2$ similar to the substrate boat 300 shown in FIGS. 3 and 4. The compressed boat 300A is in a closed position. Each of the substrate boats $301_1$ and $301_2$ is configured to support a set of substrates 340 with a distance Dsingle between one another. The substrate boats $301_1$ and $301_2$ are similar in structure except that fingers $304_1$ and $307_1$ of the substrate boat $301_1$ are positioned in different levels compared with support fingers $304_2$ and $307_2$ of the substrate boat $301_2$. The support fingers $307_1$ and $307_2$ are interleaving with one another so that the substrates 340 thereon are also interleaving with one another. When both substrate boats $301_1$ and $301_2$ are loaded with substrates 340, the substrates 340 may have a reduced distance Dcompressed to one another. In one aspect, Dcompressed=(Dsingle−substrate thickness)/2.

Since substrate boats are generally rotating in a batch processing chamber during process, volume taken by the compressed boat 300A is equal to volume taken by one substrate boat $301_1$ or $301_2$. Yet, the compressed substrate boat 300A has twice the substrate-holding capacity of the substrate boat $301_1$ or $301_2$.

A compressed boat of the present invention generally has an open and a closed position, such that in the closed position, the compressed boat may hold substrates in a high density to be processed in a batch processing chamber and in the open position, the compressed boat may be loaded and unloaded with substrates in a low density. Transition between the open and closed position may be implemented in various ways.

Figure 6:
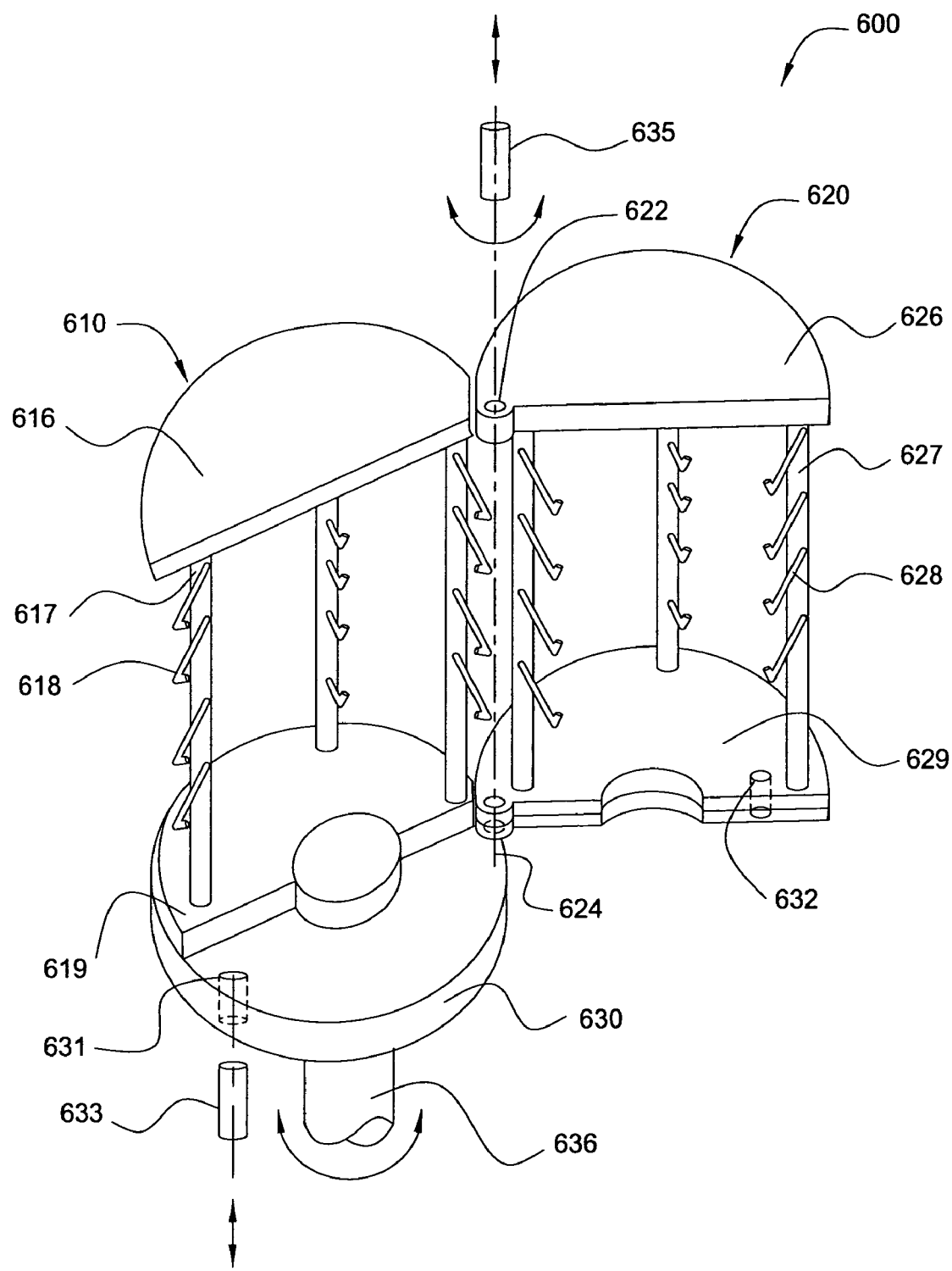
FIG. 6 is a perspective view of an exemplary compressed boat having two interleavable substrate boats connected by pivoting.

FIG. 6 is a perspective view showing how an exemplary compressed boat may be opened and closed by pivoting. A compressed boat 600 comprises a stationary boat 610, a movable boat 620 and a base 630. The base 630 may be further connected to a shaft 636 configured to rotate and vertically translate the compressed boat 600. In one aspect, the base 630 may be formed in one entity with the stationary substrate boat 610. The stationary boat 610 generally has a plurality of support members 617 each having a plurality of support fingers 618. The plurality of support members 617 are vertically connected to a top plate 616 and a bottom plated 619 which is statically connected to the base 630. The movable boat 620 generally has a plurality of support members 627 each having a plurality of support fingers 628. The plurality of support members 627 are vertically connected to a top plate 626 and a bottom plate 629 which is movably connected to the base 630 via a pivoting mechanism 624 coupled between the base 630 and the bottom plate 629. The top plate 626 of the movable boat 620 may also be coupled to the top plate 616 of the stationary substrate boat 610 via a pivoting mechanism. In this case, the top plate 626 is not connected to the top plate 616. An aperture 622 having the same axis as the pivoting mechanism 624 is generally positioned in the top plate 626.

During the opening and closing process, a support pin 635 may be generally inserted into the aperture 622, supporting the weight and the swing motion of the movable substrate boat 620. In one aspect, the supporting pin 635 may be connected to a load lock chamber where the compressed boat 600 is to be loaded and unloaded. When the compressed boat 600 is closed, the supporting pin 635 may be lifted from the aperture 622. Since substrate boats are generally operating in vacuum conditions and/or at high temperatures in which lubrication is difficult and limiting particle contamination is crucial, the usage of the support pin 635 is desirable as it generates less contact and requires less lubrication compared to a pivoting mechanism. When the compressed boat 600 is in the closed position, a locking mechanism can be provided. In this case, the compressed boat 600 may be locked/unlocked in the closed position by inserting/removing a locking pin 633 into/out of an aperture 631 in the base 630 and an aperture 632 disposed in the bottom plate 629, wherein the aperture 632 and aperture 631 are concentric when the compressed boat 600 is in the closed position.

Figure 7:
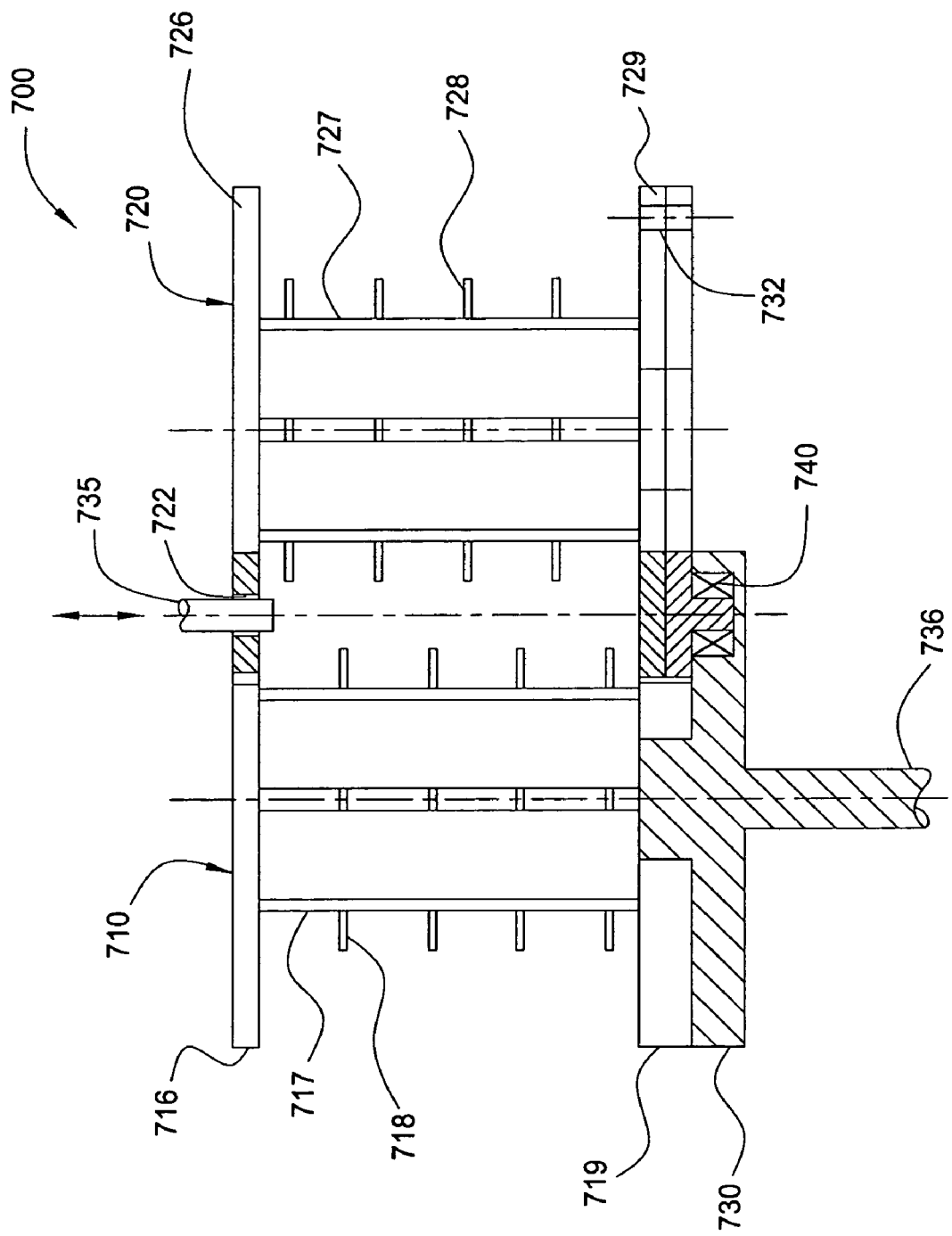
FIG. 7 is a sectional view of an exemplary compressed boat at an open position.

FIG. 7 is a sectional view of an exemplary compressed boat in an open position. A compressed boat 700 comprises a stationary boat 710, a movable boat 720 and a base 730. The base 730 may be further connected to a shaft 736 configured to rotate and vertically translate the compressed boat 700. The stationary boat 710 generally has a plurality of support members 717 each having a plurality of support fingers 718. The plurality of support members 717 are vertically connected to a top plate 716 and a bottom plated 719 which is statically connected to the base 730. The movable boat 720 generally has a plurality of support members 727 each having a plurality of support fingers 728. The plurality of support members 727 are vertically connected to a top plate 726 and a bottom plate 729 which is movably connected to the base 730 via a bearing 740 coupled between the base 730 and the bottom plate 729. During opening and closing process, a support pin 735 in line with the bearing 740 may be generally inserted into an aperture 722 positioned in the top plate 726. The support pin 735 is generally configured to support the weight and the swing motion of the movable boat 720. In one embodiment, the bearing 740 is a ceramic bearing, for example a ball-less ceramic bearing made of zirconia which resists deformation, can be operated at high temperatures and has excellent resistance to chemicals. In one aspect, the bearing 740 may be a ceramic bearing with a self-lubricating liner, such as those sold under the trademark Frelon®. Ceramic bearings with a self-lubricating liner are desirable in the vacuum and high temperature conditions in which many semiconductor processes are performed.

A compressed boat of the present invention may be constructed of any suitable material such as, for example, quartz, silicon carbide, or graphite, depending on desired process characteristics.

A compressed boat may be assembled from two substrate boats, one of which moves away from the other during loading and unloading. The two substrate boats, each configured to hold a set of substrates, may be assembled in a way that the two sets of substrates interleave with one another. In one embodiment, one of the two substrate boats rotates away from the other during loading and unloading. In another embodiment, one of the two substrate boats moves away with a linear movement. In one embodiment, the two substrate boats are connected to one another. In another embodiment, one substrate boat may be interchangeably plugged into the other.

In one embodiment of the present invention, a compressed boat may have susceptors which are configured to obtain desired heat transferring and/or mass flow.

For some processes to be performed in a batch processing chamber, for example, ALD and CVD, to achieve uniform and desirable process results on all substrates in a batch requires that every point on all the substrates in the batch attain the same set point temperature plus or minus only about 1 degree Celsius. In a batch processing chamber, substrates may be heated by radiant energy delivered from heating structures positioned on chamber side walls. In this configuration, edge of the substrate is likely to be heated faster than the rest of the substrate since it is positioned closer to the heating structure. Referring to FIG. 1, during process, the substrate 140 being processed may rest directly on a susceptor 104 which is sized such that it is larger than the diameter of the substrate 140 so that it can absorb the radiant energy delivered from the heating structure adjacent to a sidewall before it reaches the substrate edge. The presence of a susceptor with a larger diameter than the substrate also preheats process gas before it reaches the substrate edge. When process temperature is varied during different phases of a process recipe by varying the amount of energy transferred to the substrates from a heating structure positioned adjacent a side wall of a batch processing chamber, it may be necessary to minimize the thermal mass of the substrate boat 101 to allow the substrate temperature to be adjusted rapidly during the process. Most semiconductor processes are very sensitive to particle contamination especially as feature size gets smaller and smaller. Physical contact between substrates and processing apparatus is generally one source of particle contamination. To minimize contamination from contact, it may be desirable to suspend a substrate between two susceptors, such as support the substrate with three or more pins attached to a substrate boat.

For some processes to be performed in a batch processing chamber, for example, ALD and CVD, gas flow distribution across the surface of the substrates is vital to the formation of uniform layers upon substrates processed in the batch processing chamber, especially for high rate CVD processes that are dominated by mass transport limited reactions and for ALD processes where rapid surface saturation is required for reaction rate limited deposition. The edge of the substrate tends to be exposed to a higher concentration of the process gas than the center which can lead to variations in the deposited film thickness and/or contamination due to the presence of unreacted excess precursor on the surface of the deposited film at the edge of the substrate. Process gas may be injected to a batch processing chamber in a substantially parallel process gas flow which allows for the rapid saturation of the processing surface(s) of the substrate. Apparatus and methods of injecting a substantially parallel process gas flow in to a batch processing chamber are described in U.S. Patent Application No. 60/642,877, entitled "FLEXIBLE SUBSTRATE SEQUENCING SYSTEM USING A BATCH PROCESSING CHAMBER" filed on Jan. 10, 2005, which is hereby incorporated by reference in its entirety.

Gas velocity across each substrate depends on the gap between the substrate and its neighboring susceptors (one above and below the substrate), as well as on the gap between the outside edge of the susceptors and side wall. The different gaps can each have an effect on the repeatability and uniformity of the deposited film since it will directly affect the gas flow across the surface of the substrate. In general, the gap between a substrate and its corresponding upper susceptor is preferably in the range of about 0.15 to about 1.5 inches. The gap between susceptors and side walls, the gap between susceptors and injection assembly, and/or the gap between susceptors and the exhaust assembly, is preferably less than or equal to the gap between two subsequent susceptors. Preferably the gap between the side wall and the susceptor is between about 0.05 and about 1.0 inches. Minimizing the distance between the side wall and the susceptors improves heat transfer to the susceptors.

Although susceptors provide desirable heat transfer and/or mass flow, providing susceptors in a conventional substrate boat usually increases the pumping volume of the substrate boat because an extra distance for robot access between neighboring substrates is needed for a robot to load/unload the substrates. One embodiment of the present invention provides a substrate boat with susceptors without requiring extra pumping volume.

Figure 8:
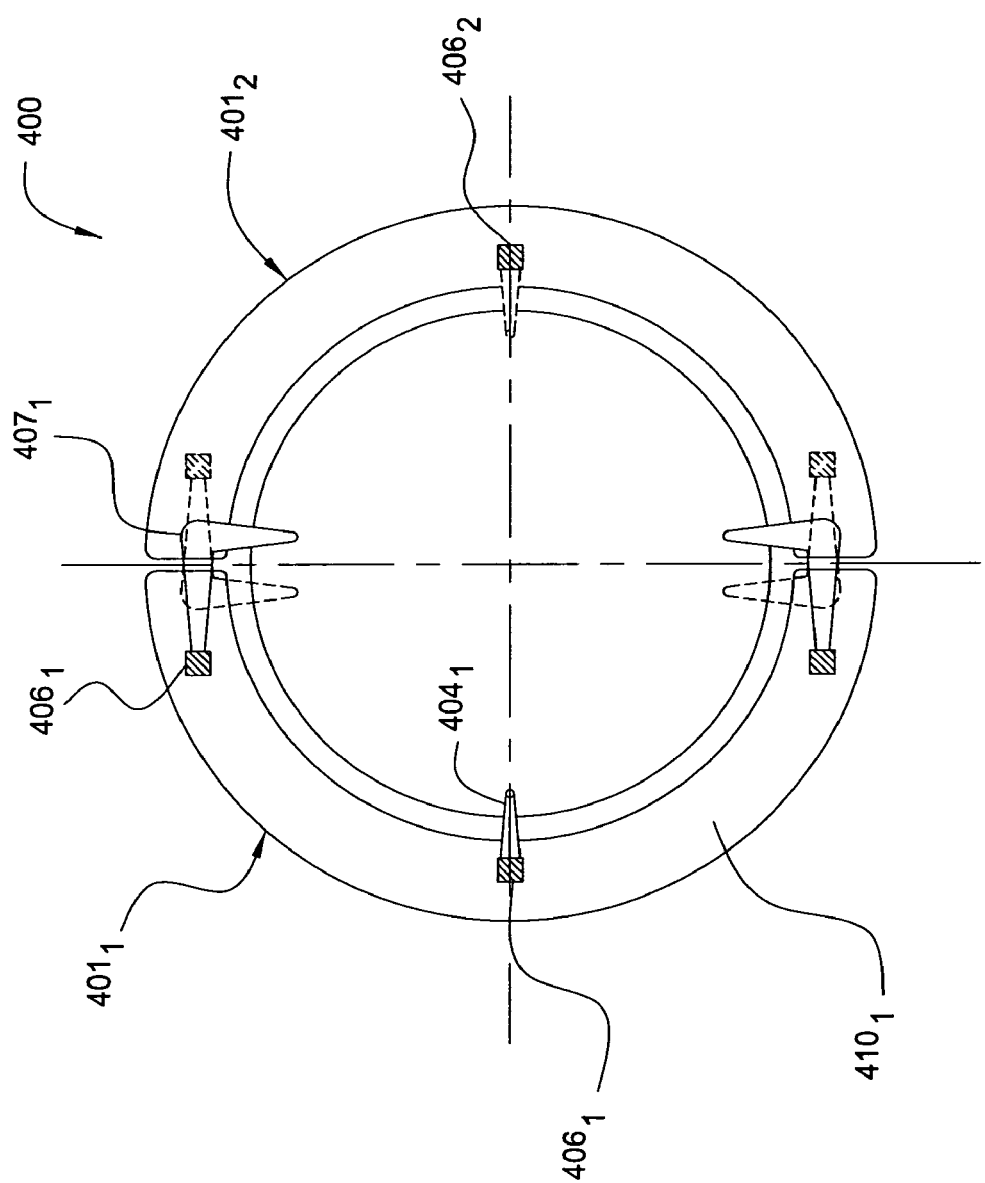
FIG. 8 is a schematic top view of a compressed boat having two interleavable substrate boats with susceptors.
Figure 9:
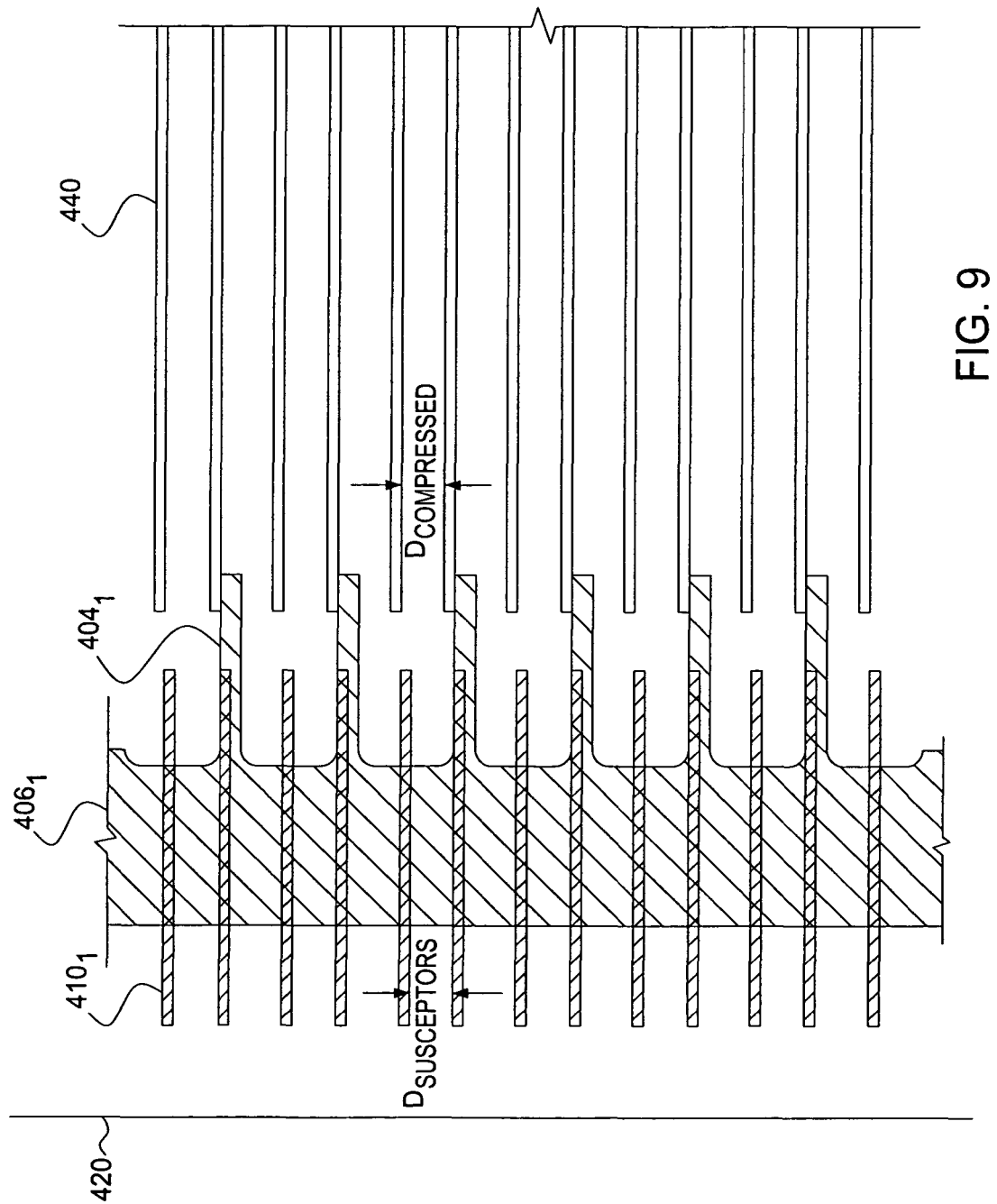
FIG. 9 is a partial sectional view of an exemplary interleavable substrate boat with susceptors.

FIGS. 8 and 9 are a schematic sectional top view and a schematic partial sectional side view of an exemplary compressed boat with susceptors. A compressed boat 400 comprises two interleavable substrate boats 401$_1$ and 401$_2$ similar to the interleavable substrate boat shown in FIGS. 3 and 4 except that substrate boats 401$_1$ and 401$_2$ each has a plurality of cage like susceptors 410$_1$ and 410$_2$. The compressed boat 400 is in a closed position. Each of the substrate boats 401$_1$ and 401$_2$ is configured to support a set of substrates 440 with a distance Dsingle between one another. The interleavable substrate boats 401$_1$ and 401$_2$ are similar in structure except that supporting fingers 404$_1$ and 407$_1$ of the substrate boat boats 401$_1$ are positioned at different levels compared with support fingers 404$_2$ and 407$_2$ of the substrate boat 401$_2$. The support fingers 407$_1$ and 407$_2$ are interleaving with one another so that the substrates 440 thereon are also interleaving with one another. The susceptors 410$_1$ and 410$_2$ having a shape of a semi ring may be generally formed on the support members 406$_1$ and 406$_2$ respectively. Shown in FIG. 9, there are twice as many susceptors 410$_1$ as support fingers 404$_1$ in the support members 406$_1$ such that when the compressed boat 400 is loaded and closed, each substrate 440 supported by the compressed boat 400 may have two corresponding half ring susceptors 410$_1$ and 410$_2$ surrounding its outer perimeter. In this embodiment, the substrates 440 are supported at three points which limits particle contamination, the substrates 440 are interleaving which reduces process volume, and the susceptors 410$_1$ and 410$_2$ optimize heat transfer and mass flow.

The susceptors 410$_1$ and 410$_2$ (collectively 410) of the compressed boat 400 may be made of silicon, silicon carbide or silicon carbide coated graphite. In one embodiment, the susceptors 410 may have a thickness of 1 mm. In this case, when the neighboring substrates 440 in the compressed boat 400 have a distance Dcompressed=4 mm, the neighboring susceptors 410 may have a gap about Dsusceptor=3.8 mm to allow gas flow.

Figure 10:
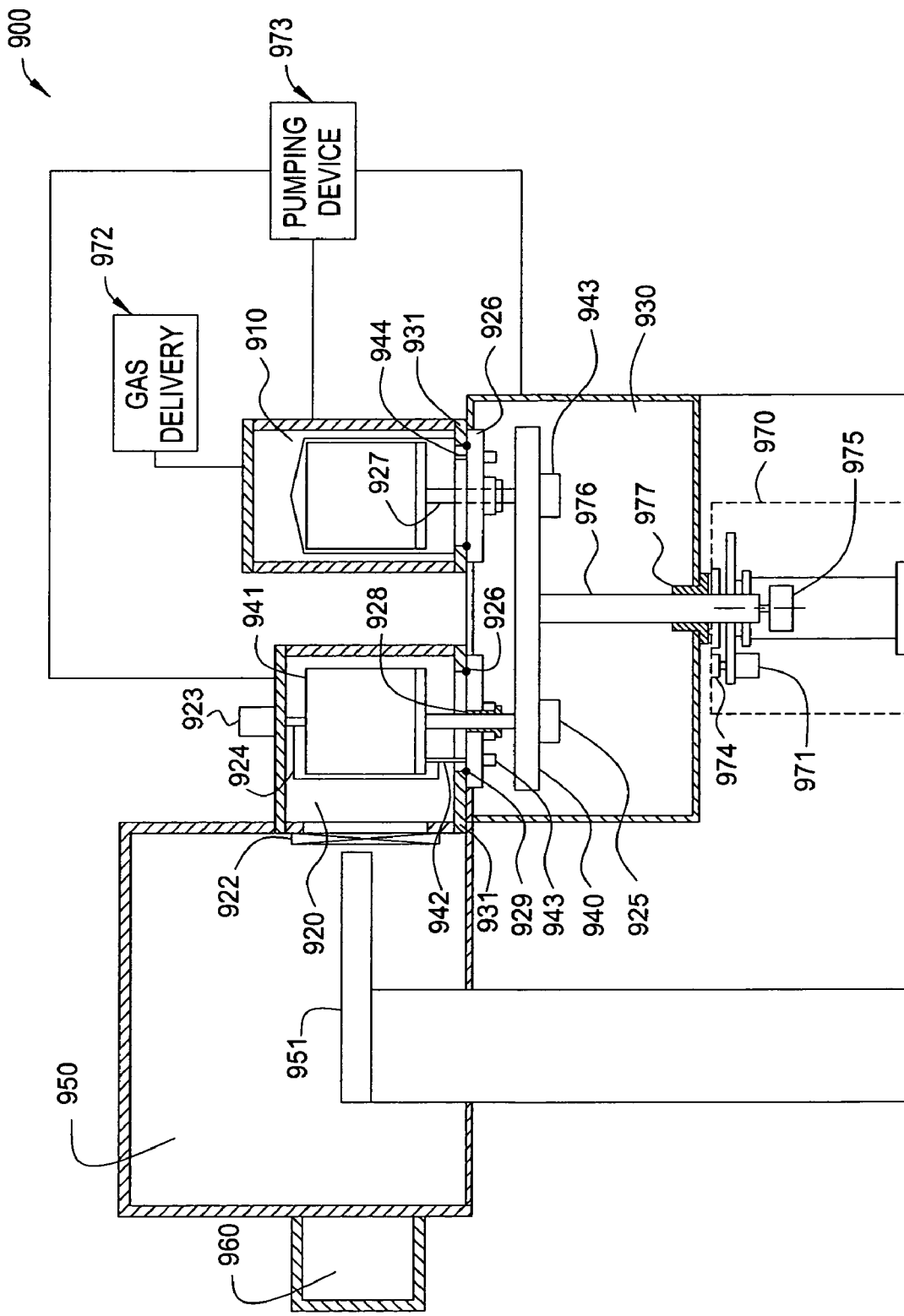
FIG. 10 is a schematic side view of an exemplary batch processing system having compressed boats.
Figure 11:
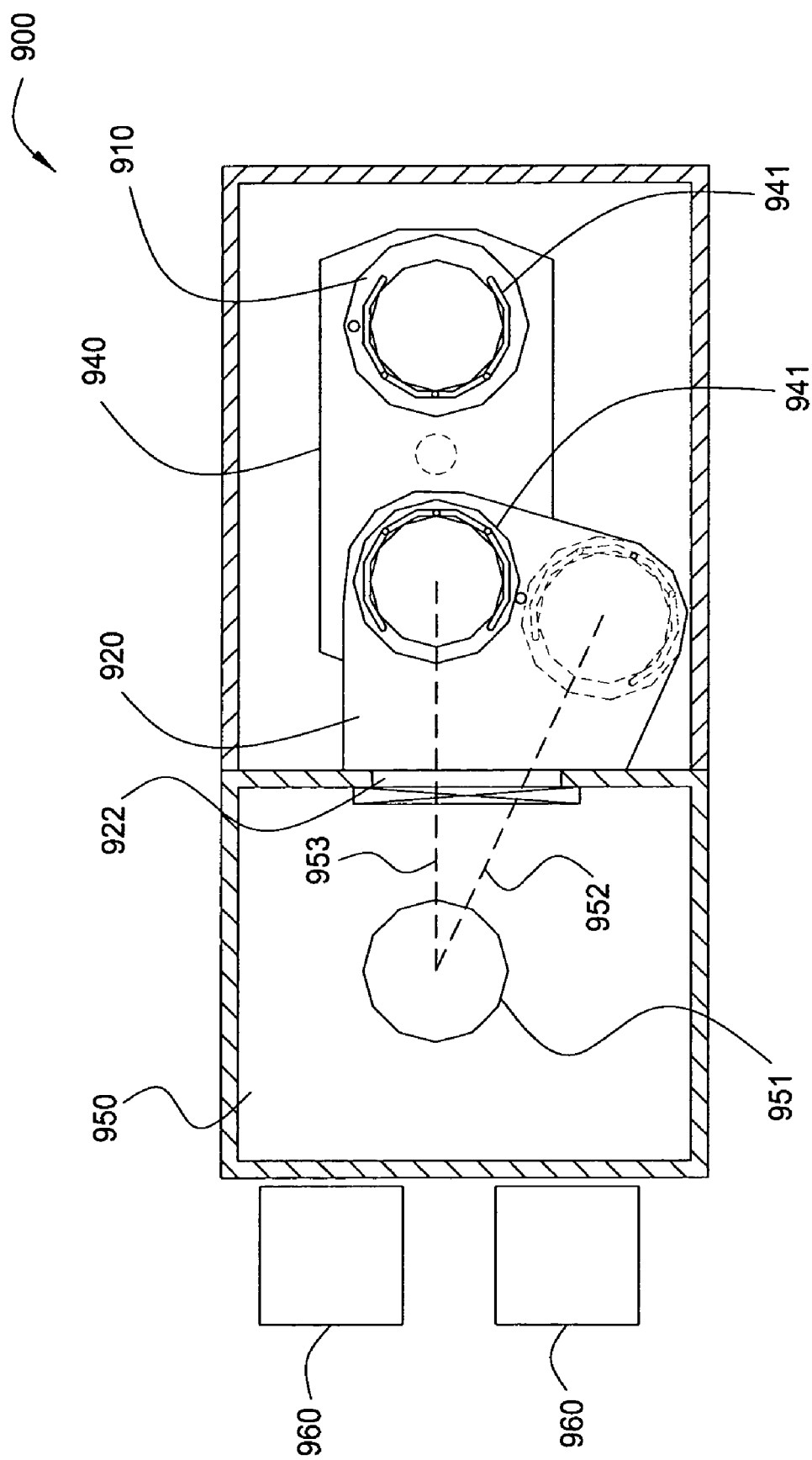
FIG. 11 is a schematic top view of an exemplary batch processing system having compressed boats.

FIGS. 10 and 11 are schematic views of an exemplary batch processing system 900 having compressed boats from side and top respectively. The batch processing system 900 is configured to run a process and load/unload substrates simultaneously which reduces load/unload and stabilization time. The batch processing system 900 generally has a process chamber 910 configured for processing substrates therein and a load lock 920 configured for loading/unloading substrates. The process chamber 910 and the load lock 920 may be positioned side by side at the same level. A swap chamber 930 configured for swapping substrates between the load lock 920 and the process chamber 910 is generally positioned underneath the process chamber 910 and the load lock 920. The swap chamber 930 is generally in selective fluid communication with the process chamber 910 and the load lock 920. An O-ring structure 931 may be generally positioned at an interface between the swap chamber 930 and the load lock 920 and between the swap chamber 930 and the process chamber 910 respectively. All three chambers 910, 920 and 930 may be in fluid communication with a pumping device 973 and may be pressurized and/or pumped out independently. The process chamber 910 may be connected to a gas delivery system 972 depending on a recipe step configured to run within. A gas delivery system used in a batch processing chamber that may be adapted to benefit from the invention is described in U.S. Patent Application No. 60/642,877, entitled "FLEXIBLE SUBSTRATE SEQUENCING SYSTEM USING A BATCH PROCESSING CHAMBER" filed on Jan. 10, 2005, which is hereby incorporated by reference in its entirety.

Two compressed boats 941 are generally attached to a boat table 940 which is disposed in the swap chamber 930. The boat table 940 may be attached to a shaft 976 which extends out of the swap chamber 930 via a rotary seal 977 disposed at a bottom of the swap chamber 930. The shaft 976 may be coupled with a lift and swap mechanism 970 underneath the swap chamber 930. In one aspect, the lift and swap mechanism 970 may comprises a motor 971, a lift 974, and a rotary table 975. The lift 974 is configured to move the shaft 976 and the boat table 940 up and down. The compressed boats 941 may be also moved up and down. When both compressed boats 941 are lowered inside the swap chamber 930, the rotary table 975 may rotate the shaft 976 and the boat table 940 by 180 degrees, hence swap the two compressed boats 941. The lift and swap mechanism 970 may be actuated by hydraulic, pneumatic or electrical motor/lead screw mechanical actuators all well known in the art.

Each of the two compressed boats 941 is generally mounted on the boat table 940 through a shaft 927. The compressed boats 941 are generally configured to rotate during process for even distribution of heat and/or processing gases. The shaft 927 may be further coupled to a rotary mechanism 925 configured to rotate the compressed boat 941 via the shaft 927. In one aspect, the rotary mechanism 925 may comprise a rotation motor. In one embodiment, the distribution of heat energy is further optimized by rotating the boat during processing. The rotation speed of the boat may vary from about 0 to 10 revolutions per minute (rpm), but preferably between 1 rpm to 5 rpm.

A seal plate 926 may be generally provided to each compressed boat 941 to insulate the process chamber 910, the load lock 920, and the swap chamber 930 from one another when the compressed boats 941 are in up position (as shown in FIG. 10). The seal plate 926 may be positioned immediately below the compressed boat 941. In one embodiment, the seal plate 926 may be mounted on the shaft 927 through a rotary seal 928. In one aspect, the seal plate 926 may be circular, constructed from a suitable high temperature material such as for instance graphite or silicon carbide, and may have a quartz ring 929 nested into a groove around an outer periphery of its top surface. The quartz ring 929 may be provided on the seal plate 926 to enhance the sealing between chamber walls and the seal plate 926. When the compressed boats 941 are elevated by the lift and swap mechanism 970 into the load lock 920 and the process chamber 910 and the quartz rings 929 of the seal plates 926 is moved into intimate contact with inner lips of the O-ring structures 931, the seal plates 926 provide an almost complete seal between the swap chamber 930 and the process chamber 910/the load lock 920.

A boat opening mechanism 924 configured to open and close the compressed boats 941 may be positioned inside the load lock 920. The boat opening mechanism 924 may be driven by a motor 923 positioned outside the load lock 920. A boat locking mechanism 943 may be mounted on the seal plate 926 to operate a locking pin 942 configured to lock the compressed boat 941 in its closed position.

Figure 12:
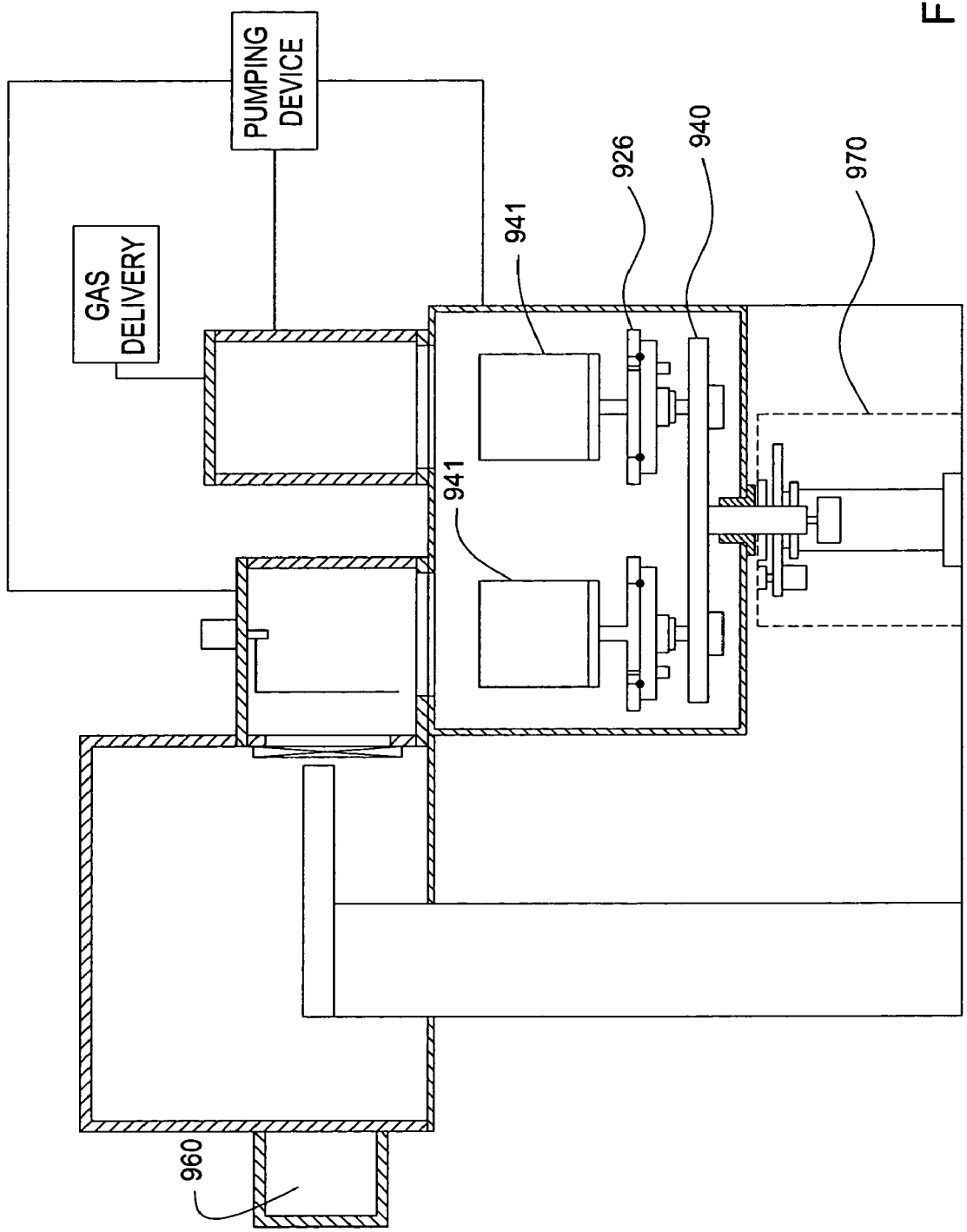
FIG. 12 is a schematic side view of an exemplary batch processing system having compressed boats in swap position.

The load lock 920 is in selective communication with an optional front-end environment 950 (also referred herein as a Factory Interface or FI) via a vacuum sealed load lock door 922 attached to a wall side wall of the load lock 920. A factory interface robot 951 disposed in the front-end environment 950 are capable of linear, rotational, and vertical movement to shuttle substrates between the load lock 920 and a plurality of pods 960. Referring to FIG. 12, the FI factory interface robot 951 may face the opened compressed boat 941 in directions of 952 and 953 to insert/remove substrates into/from the compressed boat 941.

FIG. 12 is a schematic view of an exemplary batch processing system having compressed boats in a swapping position. In this position, processed substrates and unprocessed substrates swap positions from a 180-degree rotation of the boat table 940. The compressed boats 941 are lift up back to the process chamber 910 and the load lock 920 respectively.

In operation, one of the two compressed boats 941 arrives in the load lock 920 while the other arrives in the process chamber 910 at the same time. The compressed boat 941 arrives in the load lock 920 carrying processed substrates and the compressed boat 941 arrives in the process chamber 910 carries unprocessed substrates.

In the load lock 910, the compressed boat 941 having processed substrates may be cooled down first if necessary. Then the load lock 910 will be pressurized by the pumping device 973 and the load lock door 922 may be opened. The compressed boat 941 with processed substrates may be unlocked, for example by the boat lock mechanism 944 to unlock the compressed boat 941. The compressed boat 941 with processed substrates may then be opened and held in an opened position by the boat opening mechanism 924. The factory interface robot 951 may unload the processed substrates from both sides of the compressed boats 941 and then load the compressed boat 941 with unprocessed substrates. Next, the boat opening mechanism 924 may close the compressed boat 941, and the boat lock mechanism may lock the compressed boat 941. The load lock door 922 may be closed and the load lock 920 may be pumped down. In one aspect, the compressed boat 941 now having unprocessed substrates may be preheated. While the compressed boat 941 in the load lock 920 is cooled down, opened, unloaded, reloaded, closed and preheated, a processing step is performed in the process chamber 910 to the substrates held by the compressed boat therein. The compressed boat 941 is locked and rotated.

When the processing step is finished, the process chamber 910 is pumped down. Next, both compressed boats 941 are lowered into the swap chamber 930 by the lift and swap mechanism 970.

In one aspect, the swap chamber 930 may be pumped down prior to lowering the compressed boats 941. In one aspect, the swap chamber 930 may be always under vacuum to minimize pumping volume. When the compressed boats 941 reach their lowered position, the lift and swap mechanism 970 may rotate the boat table 940 by 180 degrees such that the two compressed boats 941 swap positions. The lift and swap mechanism 970 may lift the two compressed boats 941 back up to the process chamber 910 and the load lock 920 respectively. The seal plates 926 contact the O-ring structures 931 and seal the swap chamber 930 from the load lock 920 and the process chamber 910.

In one aspect, a compressed boat of the present invention may be configured to hold 50 substrates, with 25 substrates in each half. The distance between neighboring substrates in each half may be about 8.81 mm, and the distance between neighboring substrates in the compressed boat in a closed position may be about 4 mm, given each substrate has a thickness of about 0.8 mm. Compared to a boat of prior art with neighboring substrates spaced at a distance of 8.81 m, the compressed boat reduces pumping volume by about 65-70%.

One embodiment of the present invention generally relates to a substrate boat having a removable substrate holder configured to hold a plurality of substrates, wherein the substrate holder may be inserted into or removed from the substrate boat along with the plurality of substrates held thereon. This configuration is desirable during batch processing in several aspects. In one aspect, although the usage of a batch processing chamber reduces processing time by processing a batch of substrates simultaneously, loading and unloading process, during which the batch processing chamber stays idle, takes extra time since the substrates are generally handled one by one by a robot. The loading and unloading process may be even longer when cooling down of processed substrates and preheating of unprocessed substrates are required in a step recipe. Swappable substrate boats may be used to cut the idle time of the batch processing chamber. However, the swappable substrate boats may be complicated and expensive because each substrate boat generally needs to be lifted and rotated independently and swapping the substrate boats generally requires a complex mechanism. A removable substrate holder enables loading or unloading a batch of substrates into/from a substrate boat simultaneously, which shortens idle time of a batch processing chamber with one substrate boat, thus, increasing system throughput and reducing COO without engaging a complicated boat system. In another aspect, susceptors formed in a substrate boat provide desirable heat transfer and/or mass flow. However, providing susceptors in a conventional substrate boat usually increases pumping volume of the substrate boat because an extra distance for robot access between neighboring substrates is needed for a robot to load/unload the substrates.

The present invention relates to embodiments of substrate boats having susceptors with a relatively small increase of pumping volume. A substrate boat of the present invention generally comprises a removable substrate holder which may be loaded/unloaded away from the substrate boat and then assembled into the substrate boat in a manner that substrates thereon are interleaving with the susceptors of the substrate boat. The susceptors in the substrate boat only slightly increases pumping volume since the susceptors are not interfering with loading/unloading of the substrates.

Figure 13:
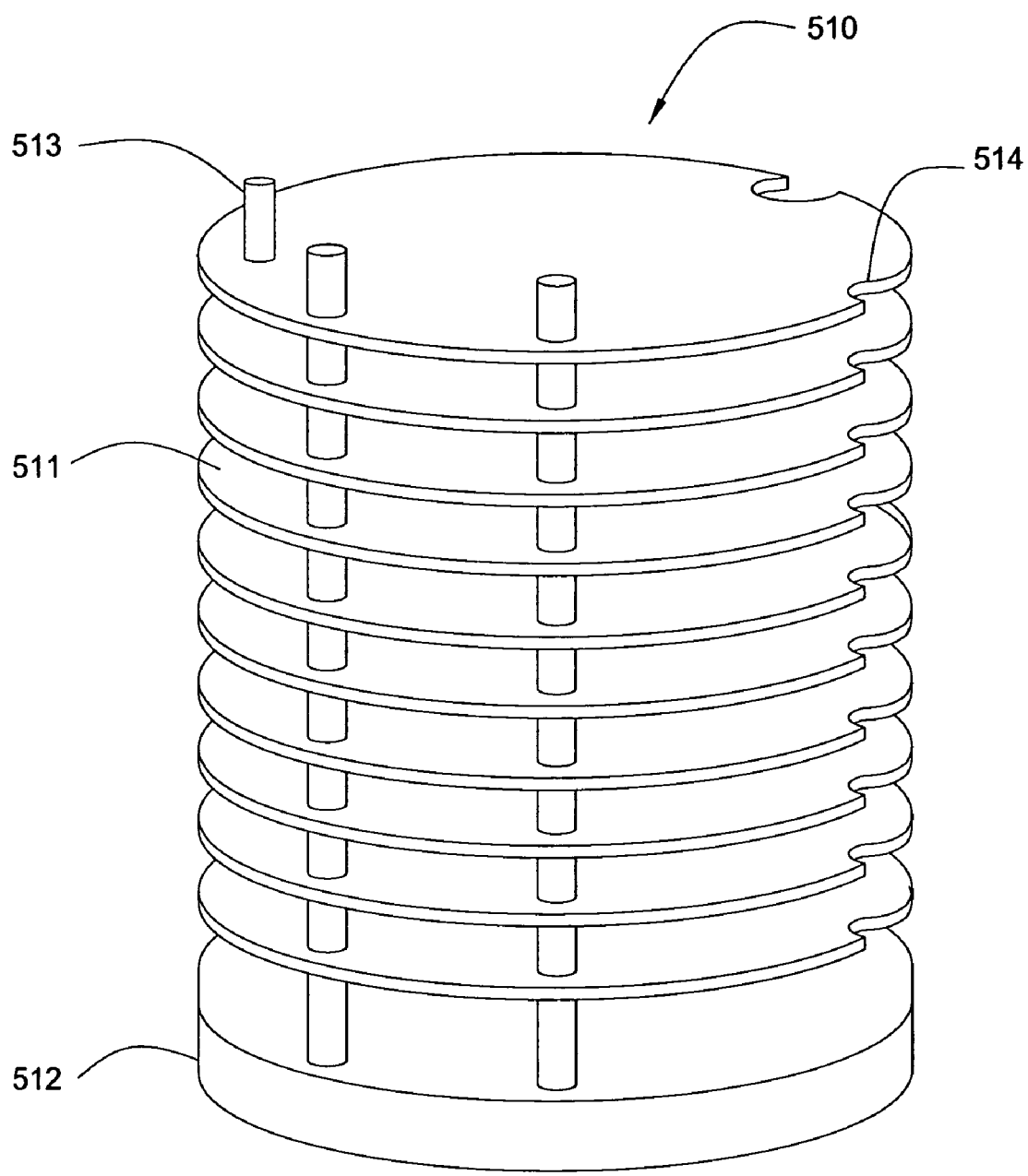
FIG. 13 is a perspective view of an exemplary substrate boat to be assembled with a substrate holder.

FIG. 13 is a perspective view of an exemplary substrate boat 510 to be assembled with a removable substrate holder. A base member 512 having a circular shape is generally connected to a plurality of support members 513. In one aspect, the support members 513 are arranged within one side of the base member 512 along a perimeter. A plurality of susceptors 511 parallel to one another are generally attached to the support members 513. In one aspect, the plurality of susceptors 511 may be a plurality of disks each having a plurality of openings 514 on an opposite side of the support members 513. In another embodiment, the susceptors 523 may be a plurality of rings. The openings 514 on each susceptors 511 are vertically inline and are configured to accommodate a substrate holder, for example, a removable substrate holder 520 shown in FIG. 14. In one aspect, the susceptors 511 may be evenly distributed along the height of the support members 513. An extra long distance may be placed between the base member 512 and the susceptor 511 next it to accommodate a base of a substrate holder. In one aspect, a locking mechanism (described in detail in FIGS. 19 and 20) may be disposed on the base member 513 to lock and secure a removable substrate holder in position.

A substrate boat of the present invention may be constructed of any suitable material such as, for example, quartz, silicon carbide, or graphite, depending on desired process characteristics.

Figure 14:
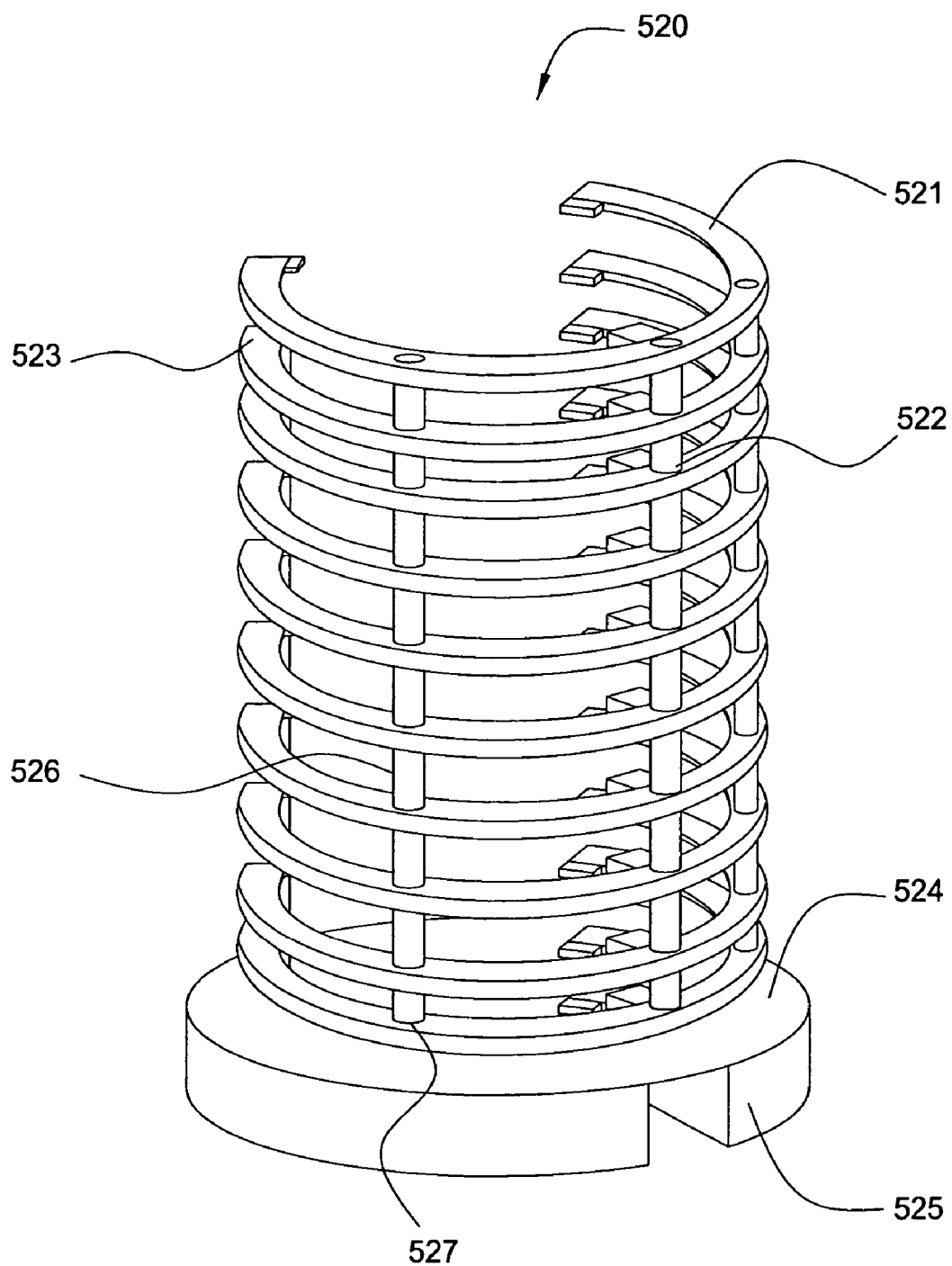
FIG. 14 is a perspective view of an exemplary substrate holder to be assembled with a substrate boat.

FIG. 14 is a perspective view of an exemplary substrate holder to be removably assembled to a substrate boat, for example, the substrate boat 510 shown in FIG. 13. The substrate holder 520 generally includes a holder base 524 connected to a plurality of support rods 522. The holder base 524 may be a partial disk having a plurality of slots 525 constructed on a bottom side configured to engage a loader of a batch processing system. A plurality of support rings 521 parallel to one another are generally attached to the support rods 522. Each of the support rings 521 is a partial ring with an arc greater than 180 degrees. At least three support pins 523 configured to contact a substrate are attached to each of the support rings 521. In one aspect, the support pins 523 are positioned at two ends and a center of the arc of each support rings 521. In one aspect, the support pin 523 may have a shape of a comb which provides solid support to the substrate thereon with reduced thermal mass. In one aspect, each support rod 522 may includes two portions: a thicker portion 527 configured to bear weight positioned between the holder base 524 and the support ring 521 immediately next to the holder base 524, and a thinner portion 526 configured to provide a structure frame for the support rings 521 positioned across the support rings 521. In one aspect, the thinner portion 526 may not be in line with the thicker portion 527.

A substrate holder of the present invention may be constructed of any suitable material such as, for example, quartz, silicon carbide, or graphite, depending on desired process characteristics.

Figure 15:
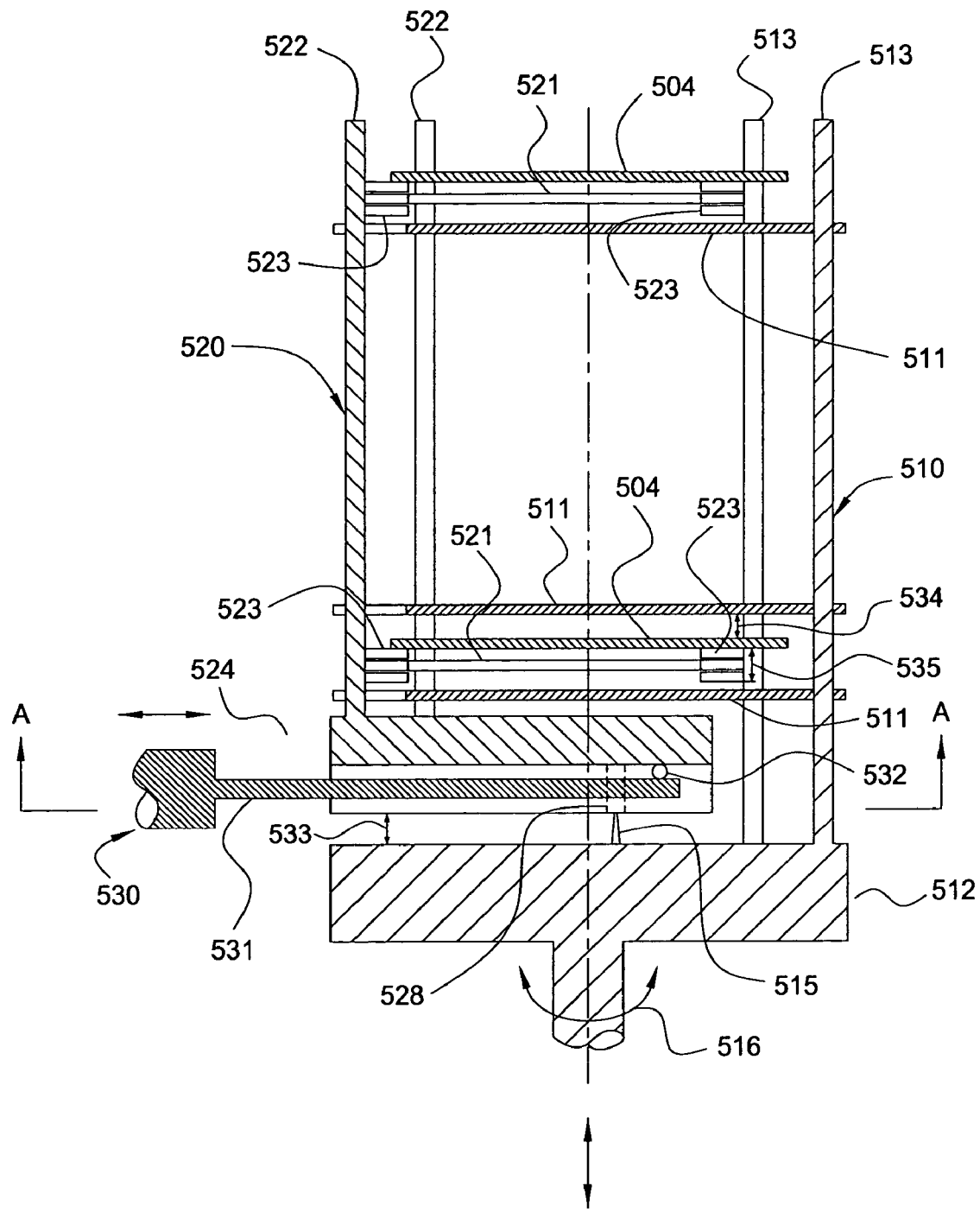
FIG. 15 is a schematic sectional view of the substrate boat being engaged to the substrate holder by a loader of a batch processing system.
Figure 16:
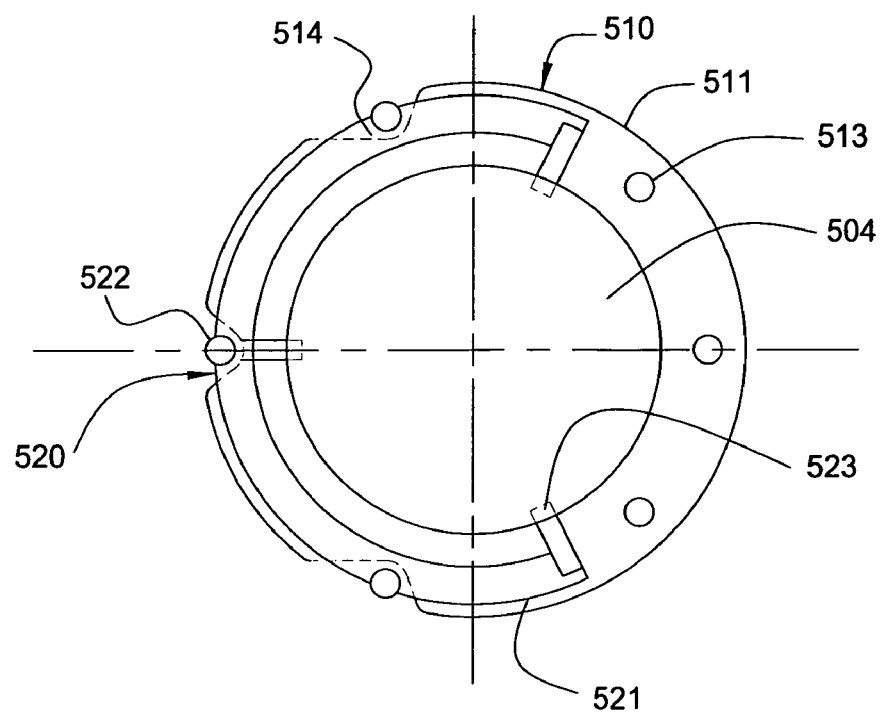
FIG. 16 is a schematic top view of a substrate boat assembled with a substrate holder.
Figure 17:
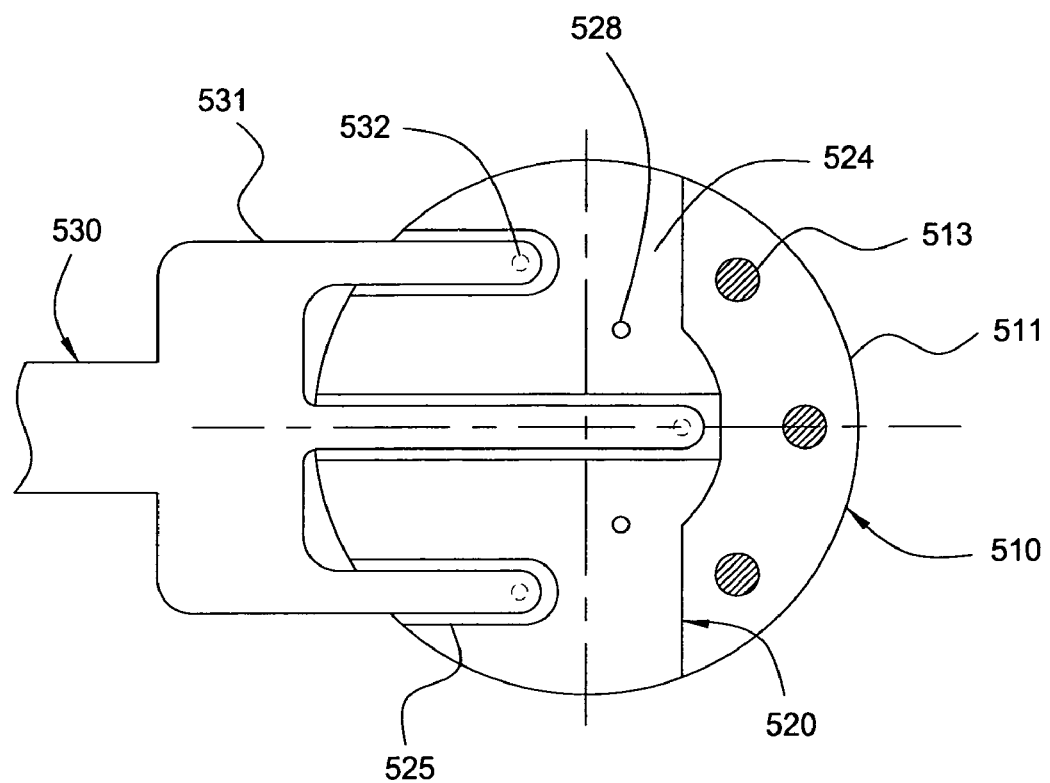
FIG. 17 is a schematic sectional view along line A-A in FIG. 15.

FIG. 15 is a schematic sectional view of the substrate boat 510 being engaged to the substrate holder 520 by a loader 530 of a batch processing system. FIG. 16 is a schematic top view of the substrate boat 510 assembled with the substrate holder 520. FIG. 17 is a schematic sectional view along line A-A in FIG. 15.

Referring to FIG. 15, the substrate holder 520 is supported by the loader 530 with a plurality of loader fingers 531 plugged into the slots 525 at the bottom side of the base member 512 (also shown in FIG. 17). Each of the loader fingers 531 may have a contact pin 532 to direct contact with the substrate holder 520. The contact pins 532 reduce contact areas between the substrate holder 520 and the loader fingers 531 resulting in less particle contamination. During the assembly process, the substrate holder 520, loaded with substrates 504, is moved horizontally by the loader 530 towards the substrate boat 510 such that the substrates 504 in the substrate holder 520 are interleaving with the susceptors 511 of the substrate boat 510. As shown in FIG. 16, when the substrate holder 520 finishes its horizontal movement, each of the support rods 522 is nested in a corresponding opening 514 on the susceptors 511. Referring back to FIG. 15, a shaft 516 may be connected to the base member 512 to convey vertical movement and rotation to the substrate boat 510. A gap 533 is present between the holder base 524 and the base member 512 when the substrate holder 520 is moving into the substrate boat 510. When the loader 530 finishes its horizontal movement, the substrate boat 510 may raise at least a distance of the gap 533 to pick up the substrate holder 520 from the loader 530. The substrate holder 520 is then rested on the base member 512. A locking mechanism may be employed to secured the assembly. In one aspect, a plurality of locking pins 515 may be inserted into corresponding locking holes 528 in the holder base 524 while the substrate boat is rising. The loader 530 is now free from contact with the substrate holder 520 and may retract from the openings 514. To disassemble the substrate holder 520 from the substrate boat 510, the loader 530 may generally move the fingers 531 into the slots 525 but not in contact with the holder base 524. The substrate boat 510 may move down, disengage the locking pins 515 from the holes 528, and drop the substrate holder 520 onto the loader 530 which may move out of the substrate boat 510 with the substrate holder 520 and the substrates thereon.

Referring FIG. 15, a gap 534 is reserved between the substrate 504 and the susceptor 511 immediately above it. The support pins 523 may require a vertical distance 535. Thus, the distance between neighboring susceptors may be at least a summation of the gap 533, the gap 534 and the distance 535. In one embodiment, the gaps 533 and 534 may be about 0.08 inches each, and the distance 535 may be about 0.10 inches. Thus, the distance between the susceptors may be at minimum of 0.26 inches.

As discussed above, susceptors formed in a substrate boat provide desirable heat transferring and/or mass flow. In this case, the susceptors 511 cover all surface areas of the substrate 504 which in turn provides direction for mass flow and heating to processing gas at all the surface areas.

Figure 18:
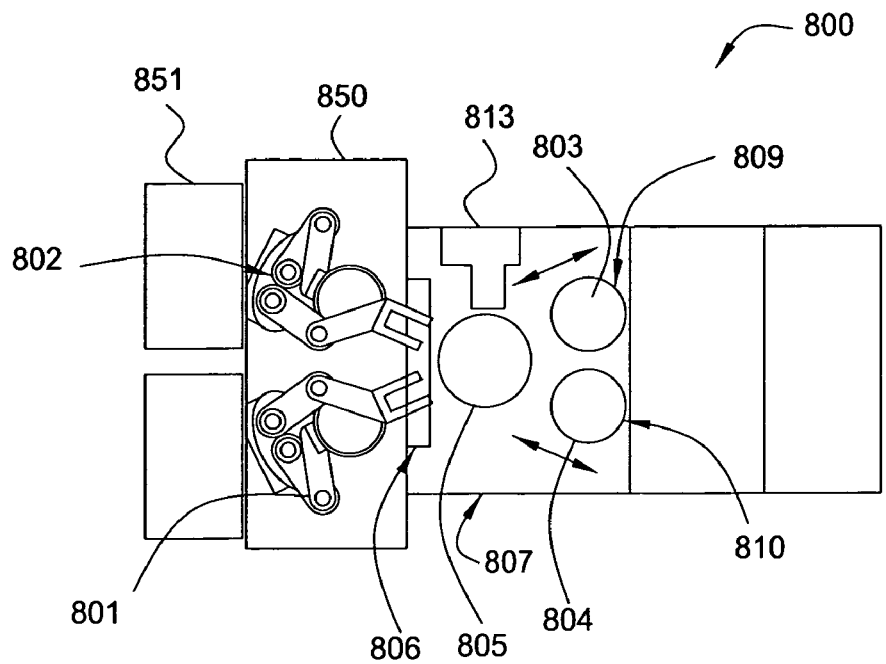
FIG. 18 is a schematic top view of a batch processing tool having an assembled boat.
Figure 19:
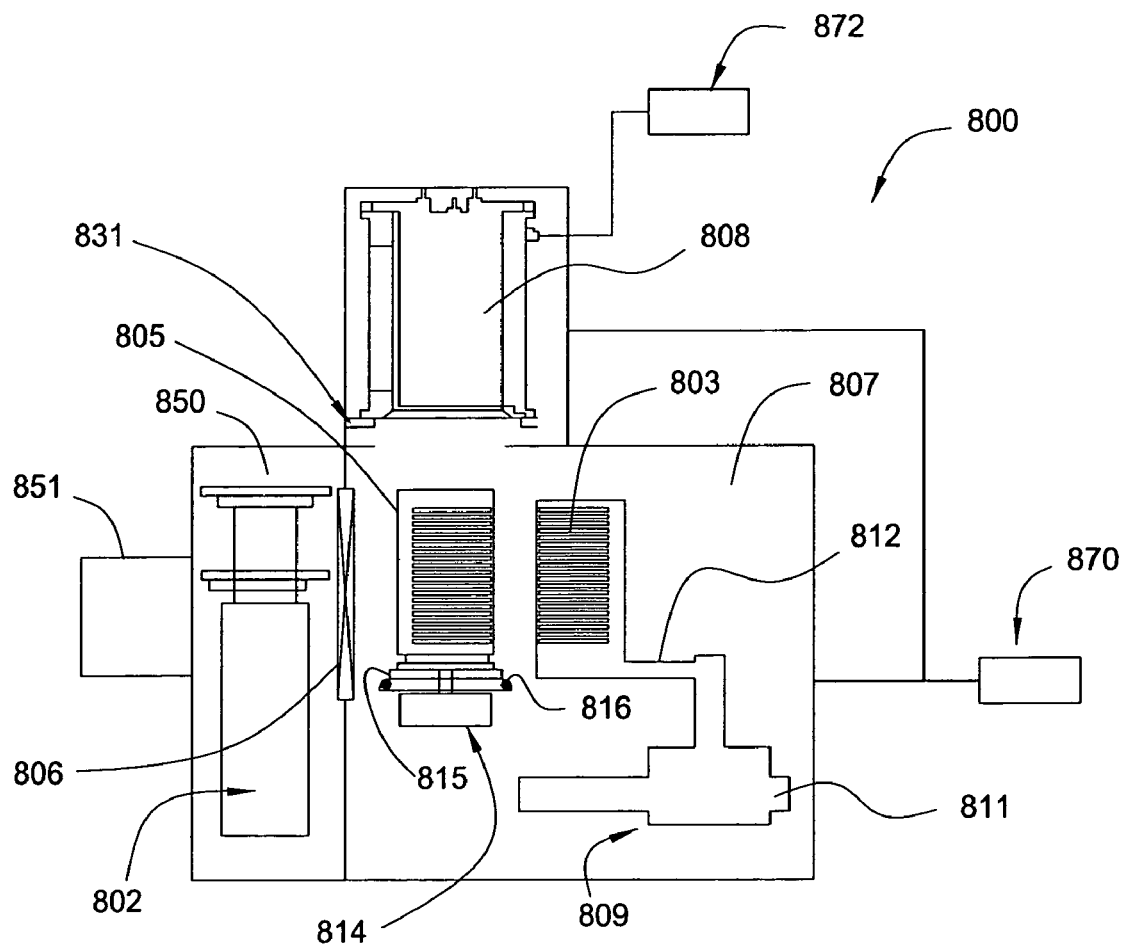
FIG. 19 is a schematic side view of the batch processing tool shown in FIG. 18.

FIG. 18 is a schematic top view of a batch processing system 800 having an assembled boat. FIG. 19 is a schematic side view of the batch processing system 800 shown in FIG. 18.

The batch processing system 800 is configured to load/unload a batch of substrates simultaneously which reduces load/unload and stabilization time. The batch processing system 800 generally has a process chamber 808 configured for processing substrates therein and a load lock 807 configured for loading/unloading substrates. The process chamber 808 and the load lock 807 may be positioned vertically from one another. In this case, the process chamber 808 is above the load lock 807. The process chamber 808 is generally in selective fluid communication with the load lock 807. An O-ring structure 831 may be generally positioned at an interface between the load lock 807 and the process chamber 808. Both chambers 807 and 808 may be in fluid communication with a pumping device 870 and may be pressurized and/or pumped out independently. The process chamber 808 may be connected to a gas delivery system 872 depending on a recipe step configured to run within. A gas delivery system used in a batch processing chamber that may be adapted to benefit from the invention is described in U.S. Patent Application No. 60/642,877, entitled "FLEXIBLE SUBSTRATE SEQUENCING SYSTEM USING A BATCH PROCESSING CHAMBER" filed on Jan. 10, 2005, which is hereby incorporated by reference in its entirety.

Two holder stations 809 and 810 are generally disposed in the load lock 807, each configured to operate one of two removable substrate holders 803 and 804. The removable substrate holders 803 and 804 are configured to support a batch of substrates and to be assembled with a substrate boat 805. In one embodiment, the substrate holders 803 and 804 may be similar to the substrate holder shown in FIG. 14 of the present invention and the substrate boat 805 may be similar to the substrate boat shown in FIG. 13 of the present invention. The holder stations 809 and 810 each generally comprises a loader 812 and a linear drive mechanism. The substrate boat 805 is generally attached to a boat support 814 which is mounted to a lift and rotation mechanism 813 disposed in the load lock 807. The lift and rotation mechanism 813 is configured to raise the substrate boat 805 into the process chamber 808, lower the substrate boat 805 to the load lock, and rotate the substrate boat 805. The lift and rotate mechanism 813 may be actuated by hydraulic, pneumatic or electrical motor/lead screw mechanical actuators all well known in the art.

A seal plate 815 may be generally provided on boat support 814 to insulate the process chamber 808 from the load lock. The seal plate 815 may be positioned immediately below the substrate boat 805. In one aspect, the seal plate 815 may be a circular, may be constructed from a suitable high temperature material such as for instance graphite or silicon carbide, and may have a quartz ring 815 nested into a groove around an outer periphery of its top surface. When the substrate boat 805 is elevated by the lift and rotation mechanism 813 into the process chamber 808 and the quartz ring 816 of the seal plates 815 is moved into intimate contact with inner lips of the O-ring structures 831, the seal plates 815 provide an almost complete seal between the process chamber 808 and the load lock 807.

The load lock 807 is in selective communication with a front end environment, e.g., Factory Interface, 850 via a vacuum sealed load lock door 806 attached to a wall side wall of the load lock 807. Two factory interface robots 801 and 802 disposed in the front-end environment 850 are capable of linear, rotational, and vertical movement to shuttle substrates between the load lock 807 and a plurality of load ports 851. Referring to FIG. 18, the factory interface robots 801 and 802 may face the substrate holders 803 and 804 respectively to insert/remove substrates into/from substrate holders 803 and 804.

In operation, the substrate boat 805 is lowered and arrives at the load lock 807 with the substrate holder 803 holding processed substrates. The substrate boat 805 turns to align with the holder station 809 which is empty. The holder station 809 removes the substrate holder 803 from the substrate boat 805. The substrate boat 805 turns with the holder station 810 which has the substrate holder 804 in dock with unprocessed substrates. The holder station 810 moves and assembles the substrate holder 804 into the substrate boat 805. The substrate boat 805 is raised and retrieved into the processing chamber 808, which is then sealed and starts a new processing step. The processed substrates in the substrate holder 803 may be cooled down, if necessary. The holder station 809 may move the substrate holder 803 to an engaging position. The load lock 807 may be pressurized, and the load lock door 806 may be opened. The robot 801 may shuffle the processed substrates into the load port 851 and load the substrate holder 803 with unprocessed substrates. The load lock door 806 is then closed, and the load lock 807 is pumped down. The holder station 809 moves the substrate holder 803 and waits for the process step to be finished in the processing chamber 808. When the process step is finished, the substrate boat 805 is lowered down again with the substrate holder 804 holding processed substrates. The system repeats the above sequence with the substrate holder 804.

While the foregoing is directed to embodiments of the present invention, other and further embodiments of the invention may be devised without departing from the basic scope thereof, and the scope thereof is determined by the claims that follow.

What is claimed is:

1. A compressed substrate boat in a batch processing chamber, comprising:
    a first substrate boat having a first plurality of substrate supports defining a first plurality of parallel planes;
    a second substrate boat having a second plurality of substrate supports defining a second plurality of parallel planes; and
    a connecting mechanism connecting the first substrate boat and the second substrate boat, such that the first plurality of parallel planes are interleaved with the second plurality of parallel planes when the compressed substrate boat is in a closed position and the first and second substrate boats are independently loadable when the compressed substrate boat is in an open position.

2. The compressed substrate boat of claim 1, wherein the connecting mechanism comprises a pivot.

3. The compressed substrate boat of claim 2, wherein the pivot comprises a ceramic bearing.

4. The compressed substrate boat of claim 1, wherein each of the first and second substrate boats comprises:
    a top plate;
    a bottom plate; and
    at least three supporting bars each having a plurality of the substrate supports, wherein the top plate and the bottom plate are connected by the at least three supporting bars.

5. The compressed substrate boat of claim 4, wherein the substrate supports of the first and second substrate boats are configured to contact the substrate at three points along a perimeter and the three points form an arc between 190 and 200 degrees.

6. The compressed substrate boat of claim 1, wherein each of the first and second substrate boats comprises:
    a top plate;
    a bottom plate;
    at least three supporting bars; and
    a plurality of the substrate supports attached to the at least three supporting bars.

7. A substrate boat for a batch processing system, comprising:
    a boat body having a first plurality of substrate supports defining a first plurality of parallel planes; and
    a substrate holder having a second plurality of stacked substrate supports defining a second plurality of parallel planes, wherein the substrate holder is removably connected to the boat body, such that the first plurality of parallel planes are interleaved with the second plurality of parallel planes when the boat body is connected to the substrate holder.

8. The substrate boat of claim 7, wherein the boat body comprises:
    a base member; and
    a plurality of support members vertically connected to the base member wherein the first plurality of substrate supports are formed on the plurality of support members in a stacked manner.

9. The substrate boat of claim 8, wherein each of the first plurality of substrate supports has a plurality of openings along a perimeter configured to accommodate the substrate holder.

10. The substrate boat of claim 7, wherein the substrate holder comprises:
    a holder base;
    a plurality of support rods; and
    a plurality of the substrate supports connected to the plurality of support rods in a stacked manner, wherein a plurality of support pins are formed on the plurality of support rings.

11. The substrate boat of claim 10, wherein the holder base has a plurality of slots constructed on a bottom side configured to engage a loader.

12. The substrate boat of claim 7, further comprising a locking mechanism configured to lock and unlock boat body and the substrate holder.

13. A substrate boat for a batch processing system, comprising:
    a boat body having a base member, a plurality of vertical support members connected to the base member, and a plurality of substrate supports defining a first plurality of parallel planes formed on the plurality of vertical support members in a stacked manner;
    a substrate holder having a holder base, a plurality of support rods, and a plurality of support rings defining a second plurality of parallel planes and connected to the plurality of support rods in a stacked manner, wherein a plurality of support pins are formed on the plurality of support rings; and
    a connector joining the substrate holder and the boat body, such that the first plurality of parallel planes and the second plurality of parallel planes are interleaved when the substrate boat is in a closed position.

14. The substrate boat of claim 13, wherein each of the plurality of substrate supports has a plurality of openings along a perimeter configured to accommodate the substrate holder.

15. The substrate boat of claim 14, wherein the holder base has a plurality of slots constructed on a bottom side configured to engage a loader.

* * * * *

UNITED STATES PATENT AND TRADEMARK OFFICE
CERTIFICATE OF CORRECTION

PATENT NO. : 7,748,542 B2
APPLICATION NO. : 11/216969
DATED : July 6, 2010
INVENTOR(S) : Yudovsky et al.

Page 1 of 1

It is certified that error appears in the above-identified patent and that said Letters Patent is hereby corrected as shown below:

Column 1, Lines 21-22, please delete "effectively improving";

Column 1, Line 49, please delete "which".

Signed and Sealed this

Twenty-sixth Day of October, 2010

David J. Kappos
*Director of the United States Patent and Trademark Office*